(12) United States Patent
Labadie et al.

(10) Patent No.: US 11,121,693 B1
(45) Date of Patent: Sep. 14, 2021

(54) RADIO FREQUENCY PORT IMPEDANCE DETECTION USING CONCURRENT RADIOS

(71) Applicant: Amazon Technologies, Inc., Seattle, WA (US)

(72) Inventors: Nathan Labadie, Gilroy, CA (US); Kun Ting Tsai, Fremont, CA (US); Cheol Su Kim, San Jose, CA (US); Kalyan Teja Posani, San Jose, CA (US); Omar Fawazhashim Zakaria, Saratoga, CA (US)

(73) Assignee: Amazon Technologies, Inc., Seattle, WA (US)

( * ) Notice: Subject to any disclaimer, the term of this patent is extended or adjusted under 35 U.S.C. 154(b) by 42 days.

(21) Appl. No.: 16/744,974

(22) Filed: Jan. 16, 2020

(51) Int. Cl.
| | |
|---|---|
| *H04B 17/318* | (2015.01) |
| *H04W 4/80* | (2018.01) |
| *H03H 7/40* | (2006.01) |
| *H04W 76/27* | (2018.01) |
| *H04W 52/02* | (2009.01) |
| *H04B 1/18* | (2006.01) |

(52) U.S. Cl.
CPC ............ *H03H 7/40* (2013.01); *H04B 1/18* (2013.01); *H04B 17/318* (2015.01); *H04W 52/0245* (2013.01); *H04W 76/27* (2018.02)

(58) Field of Classification Search
None
See application file for complete search history.

(56) References Cited

U.S. PATENT DOCUMENTS

| | | | | |
|---|---|---|---|---|
| 10,312,973 | B1* | 6/2019 | Luo | H01Q 1/44 |
| 10,483,946 | B1* | 11/2019 | Hrivnak | H04B 1/04 |
| 2011/0299431 | A1* | 12/2011 | Mikhemar | H04B 1/18 |
| | | | | 370/277 |
| 2012/0112970 | A1* | 5/2012 | Caballero | H01Q 7/00 |
| | | | | 343/702 |
| 2012/0249259 | A1* | 10/2012 | Keese | H03H 7/40 |
| | | | | 333/32 |
| 2014/0087668 | A1* | 3/2014 | Mow | H04W 24/08 |
| | | | | 455/67.14 |
| 2016/0037359 | A1* | 2/2016 | Black | H04L 5/08 |
| | | | | 370/241 |
| 2019/0215765 | A1* | 7/2019 | Ramasamy | H04W 52/367 |
| 2020/0212539 | A1* | 7/2020 | Yun | H01Q 21/065 |

* cited by examiner

*Primary Examiner* — Andrew Wendell
(74) *Attorney, Agent, or Firm* — Lowenstein Sandler LLP

(57) ABSTRACT

Technologies directed to a wireless device with RF port impedance detection using concurrent radios are described. One wireless device includes an impedance detection circuit with a bi-directional RF coupler and switching circuitry. A processing device controls the switching circuitry to i) couple the bi-directional RF coupler between a first radio and a first RF port and a second radio and a second RF port. The processing device causes a first radio to send a first signal and a second radio to measure a first receive signal strength indicator (RSSI) value of a first reflected signal. The processing device determines that the first RSSI value exceeds a threshold, the threshold representing an impedance mismatch condition at or beyond the first RF port. The processing device sends a message indicative of the impedance mismatch condition to a second device.

20 Claims, 14 Drawing Sheets

RADIO FREQUENCY PORT IMPEDANCE DETECTION USING CONCURRENT RADIOS

BACKGROUND

A large and growing population of users is enjoying entertainment through the consumption of digital media items, such as music, movies, images, electronic books, and so on. The users employ various electronic devices to consume such media items. Among these electronic devices (referred to herein as endpoint devices, user devices, clients, client devices, or user equipment) are electronic book readers, cellular telephones, Personal Digital Assistants (PDAs), portable media players, tablet computers, netbooks, laptops, and the like. These electronic devices wirelessly communicate with a communications infrastructure to enable the consumption of the digital media items. In order to communicate with other devices wirelessly, these electronic devices include one or more antennas.

BRIEF DESCRIPTION OF DRAWINGS

The present inventions will be understood more fully from the detailed description given below and from the accompanying drawings of various embodiments of the present invention, which, however, should not be taken to limit the present invention to the specific embodiments, but are for explanation and understanding only.

DETAILED DESCRIPTION

Figure 1A:
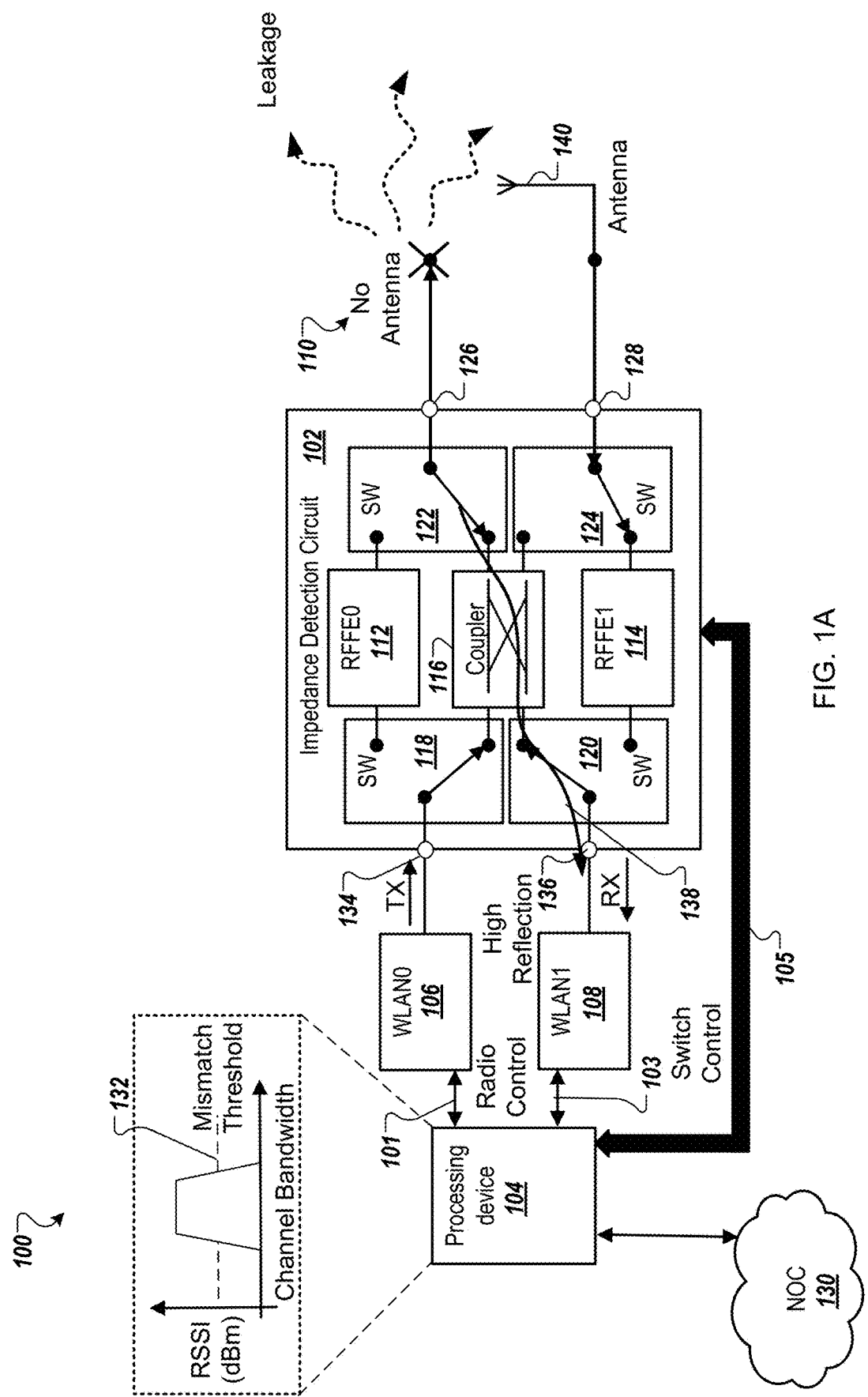
FIG. 1A is a block diagram of a wireless device with an impedance detection circuit where a first radio transmits a first signal according to one embodiment.

Technologies directed to a wireless device with Radio Frequency (RF) port impedance detection using concurrent radios are described. Many wireless devices used in a fixed wireless infrastructure use external antennas to maintain flexibility in coverage and system gain for each use case. However, antennas may be disconnected from the radio or damage to cabling, antenna, or both may occur. Under these conditions, a network operations center (NOC) may only see changes in radio link-level parameters, including receive signal strength indicator (RSSI) and throughput parameters. Degradation due to channel deterioration may be indistinguishable from a device issue where the antenna is disconnected or there is damage to an RF cable or the antenna itself. Degradation can also be caused by a physical attribute of the RF cable that causes malfunction of the RF cable. Traditionally, there is no direct feedback from devices in the fixed wireless infrastructure indicating a condition of an RF signal path external to the device. Network scalability and maintainability can be significantly impacted by these types of impedance mismatch conditions. In some cases, when a wireless device with concurrent radios is deployed and yet only a single antenna is connected, a second radio should be shut off to reduce power consumption and potential interference. This may not be done properly at staging (i.e., pre-deployment configuration) by an installer since it is difficult for the installer to know which radio to shut off, even with visual identification of the external RF ports. The manual configuration of selecting a radio to shut down by the installer is error prone.

Aspects of the present disclosure overcome the deficiencies of traditional wireless devices by providing an impedance detection circuit for concurrent, co-channel radios and an RSSI based algorithm to detect RF port impedance. Aspects of the present disclosure overcome the deficiencies of traditional wireless devices by providing a channelized frequency-domain reflectometry based algorithm to detect a physical distance to an impedance mismatch. The physical distance is between an RF port and a location where the impedance mismatch condition occurs. At any impedance mismatch, some of the energy of an incident signal is reflected backward toward the source as a reflected signal. If these reflections are excessive, the antenna system does not operate properly. Reflectometry is the use of radiation and reflections of radiation in the forms of electromagnetic pulses that are used to determine a location of an impedance mismatch condition at or beyond the RF port, such as in an RF cable coupled to the RF port. The circuitry described herein can be placed in a reflectometry mode in order to determine a physical distance between the RF port and the location where the impedance mismatch condition occurs. If the antenna is disconnected, the physical distance will be zero. If a physical attribute of the RF cable is causing the malfunction, the circuitry in the reflectometry mode can determine the physical distance to the location causing the impedance mismatch. In time-domain reflectometry, the circuit can determine the characteristics of the RF cable by observing reflected waveforms. The characterization can be used to locate the faults or discontinuities in a connector, in the RF cable, or the like. In frequency-domain reflectometry, the circuitry generates a sweep across a frequency range (e.g., frequencies of a channel) as an input into the transmission link. The circuitry (e.g., receiver) measures the interference pattern generated when the swept RF source output signal adds and subtracts with reflected signals from faults and other reflective characteristics within the tested transmission line. The circuitry can calculate a distance to a location where the impedance mismatch condition occurs based on the measured reflected signals across the frequency range.

Aspects of the present disclosure overcome the deficiencies of traditional wireless devices by providing a multi-mode impedance detection circuit with RSSI and frequency-domain reflectometry modes. Aspects of the present disclosure overcome the deficiencies of traditional wireless devices by providing airtime reservation during RSSI detection. The aspects of the present disclosure can implement an RF port impedance detection technique that uses concurrent radios, capable of co-channel operation, to detect reflected energy from an impedance mismatch caused by a disconnected RF port or damage to an RF cable or antenna itself. The aspects of the present disclosure can implement an impedance detection circuit, with an RF coupler, can intentionally couple the radios to enable sensing the impedance of the RF connector termination. An RSSI threshold condition, such as a mismatch threshold, may be set in software based on calibration measurements. In addition to an RSSI based algorithm and impedance detection circuit to detect RF port impedance, the application also includes a channelized frequency-domain reflectometry based algorithm to detect a physical distance to a location where the impedance mismatch occurs and airtime reservation during RSSI detection. Details of the channelized frequency-domain reflectometry based algorithm are described below with respect to FIGS. 3-5 and FIG. 9.

As described herein, concurrent radios capable of co-channel operation may be used to detect reflected energy from an impedance mismatch such as a disconnected RF port. Wireless devices can include wireless local area network (WLAN) radios that operate in the 2.4 GHz and 5 GHz bands and utilize various WLAN protocols, such as the Wi-Fi® protocols (e.g., 802.11n, 802.11ac, or the like). For example, many Wi-Fi® chipsets support dual concurrency on either 2.4 GHz ISM or 5 GHz U-NII bands. Typically, RF circuitry for each radio is designed to maximize isolation to avoid desensing the receivers especially for asynchronous operation (e.g., carrier-sense multiple access with collision avoidance (CSMA-CA)). However, intentional coupling between the radios enables sensing the impedance of the RF connector termination. Radio-to-radio coupling over circuit board traces (e.g., printed circuit board (PCB) traces) may be used if the RSSI level is sufficiently high. However, there may be many coupling paths interacting in complex ways. This may impact the RSSI level and stability under conditions unrelated to port impedance, including device placement relative to building structures. Therefore, in some embodiments described herein, a dedicated impedance detection circuit is used.

Various devices are described herein that include WLAN radios operate in the 2.4 GHz and 5 GHz frequency bands and utilize various WLAN protocols, such as the Wi-Fi® protocols (e.g., 802.11n, 802.11ac, or the like). The radios can utilize 2×2 spatial multiplexing Multiple-input-multiple-output (MIMO) and channel bandwidths from 5 MHz to 160 MHz. The radios can see all 5.x GHz channels, including Dynamic Frequency Selection (DFS) channels and can operates at an Equivalent Isotropic Radiated Power (EIRP) up to 36 dBmi, depending on the channel. Alternatively, other types of radios can be used to determine impedance mismatch conditions using the RF port impedance detection technologies described herein.

In one embodiment of dual concurrent radios, an impedance detection-circuit includes an RF switch matrix, a bi-directional RF coupler, and RFFE signal paths. During an impedance measurement, the RFFE circuitry is bypassed. This eliminates potential signal attenuation from amplifier reverse isolation. A second antenna (RX antenna) can be disconnected from the bi-directional RF coupler to reduce unwanted leakage between RF ports. Absorptive switches (SW_A) can be used to maintain the impedance match on coupler ports of the bi-directional RF coupler and the RFFE circuitry. When a first radio (TX radio) transmits a signal, the signal is reflected at the unmatched RF port (i.e. no antenna) and is routed through the bi-directional RF coupler back toward a second radio (RX radio). The second radio measures an RSSI value of the reflected signal. During normal radio operation, the bi-directional RF coupler is bypassed to avoid receiver desense and reduce signal loss. An example of dual concurrent radios and an impedance detection circuit is described and illustrated below with respect to FIGS. 1A-1B. In another embodiment, the coupling can be done on a PCB without a bi-directional coupler. Also, in other embodiments, the switch matrix can be simplified from the illustrated embodiments.

FIG. 1A is a block diagram of a wireless device 100 with an impedance detection circuit 102 where a first radio 106 transmits a first signal according to one embodiment. The wireless device 100 includes a processing device 104, a first radio 106, a second radio 108, and the impedance detection circuit 102. In general, the impedance detection circuit 102, under control by the processing device 104, is used to measure one or more RSSI values of a reflected signal, the reflected signal being caused by an impedance mismatch condition caused by an antenna being disconnected from a first RF port (labeled as "no antenna 110) or vi) damage to an RF cable coupled between the antenna and the first RF port (not illustrated in FIG. 1A). The RF ports are also referred to as antenna ports.

In the depicted embodiment, the first radio 106 is a first WLAN radio and the second radio 108 is a second WLAN radio, both of which are capable of co-channel operation. The first radio 106 is coupled to the processing device 104 and the processing device 104 can control the first radio 106 over a first radio control interface 101. The second radio 108 is coupled to the processing device 104 and the processing device 104 can control the second radio 108 over a second radio control interface 103. The impedance detection circuit 102 is coupled to the processing device 104 and the processing device 104 can control the impedance detection circuit 102 over a switch control interface 105.

The impedance-detector circuit 102 includes a first RF front-end (RFFE) circuitry 112, second RFFE circuitry 114, a bi-directional RF coupler 116, and switching circuitry, including a first switch 118, a second switch 120, a third switch 122, and a fourth switch 124 in the depicted embodiment. It should be noted that other configurations of switches can be used for the switching circuitry of the impedance detection circuit 102. The bi-directional RF coupler 116 includes a first port, a second port, a third port, and a fourth port. The switching circuitry, in a coupler mode, i) couples the first radio 106 to the first port, a first RF port 126 to the third port, and the second radio 108 to the second port, and ii) decouples a second RF port 128 from the fourth port. The switching circuitry, in a normal mode, iii) decouples the bi-directional RF coupler 116 from each of the first radio 106, the second WLAN radio 108, the first RF port 126, and the second RF port 128 and iv) couples the first radio 106 to the first RF port 126 via the first RFFE circuitry 112 and the second radio 108 to the second RF port 128 via the second RFFE circuitry 114. The processing device 104 can receive a first message from a device at a network operations center (NOC) 130. The device at the NOC 130 can be a remote server that manages devices in the network. The first message can include a request to check for an impedance mismatch condition caused by the first antenna being disconnected from the first RF port (no antenna 110) or vi) damage to an RF cable coupled between the first antenna and the first RF port 126. The processing device 104 sends a control signal over the switch control interface 105 to the impedance detection circuit 102 that causes the impedance detection circuit 102 to switch from the normal mode to the coupler mode. The processing device 104 instructs the first radio 106 over the first radio control interface 101 to send a first signal via the first RF port 126. The processing device 104 instructs the second radio 108 over the second radio control interface 103 to measure a first RSSI value of a first reflected signal at the second port of the bi-directional RF coupler 116. The first reflected signal 138 is caused by an impedance mismatch condition caused by the first antenna not being coupled to the first RF port 126 ("no antenna" 110) or damage to an RF cable coupled between the first antenna and the first RF port 126. The processing device 104 determines whether the first RSSI value exceeds a mismatch threshold 132. The mismatch threshold 132 represents the impedance mismatch condition. When the RSSI value exceeds the mismatch threshold 132, there is a high reflection between the first radio 106 and the second radio 108. The high reflection causes the first reflected signal 138, as well as leakage at the first RF port 126. Responsive to the processing device determining that the first RSSI value exceeds the mismatch threshold 132, the processing device sends a second message to the device at the NOC 130 (also referred to herein as a remote server that manages devices in a network). The second message includes a response with the impedance mismatch condition detected (e.g. information that identifies the first antenna not being coupled to the first RF port 126 ("no antenna" 110) or damage to an RF cable coupled between the first antenna and the first RF port 126). The processing device receives a third message from the device at the NOC 130, the third message including a command to disable the first radio 106.

In one embodiment, responsive to the first RSSI value exceeding the threshold, the processing device 104 instructs the first radio 106 to send the same signal via the first antenna in each channel in a set of channels in a frequency-domain reflectometry mode. The processing device 104 instructs the second radio 108 to measure a RSSI value for each channel in the set of channels in the frequency-domain reflectometry mode. The processing device 104 determines a physical distance between the first RF port and a location where the impedance mismatch condition occurs using the RSSI values for the set of channels. The processing device 104 sends a fourth message to the device at the NOC 130. The fourth message includes a value representing the physical distance. Alternatively, the value representing the physical distance can also be reported in the second message described above that includes an indication of the impedance mismatch condition.

The processing device 104 can include one or more Central Processing Units (CPUs), microcontrollers, field programmable gate arrays, or other types of processors or processing devices. The processing device 104 can implement processing logic that comprises hardware (e.g., circuitry, dedicated logic, programmable logic, microcode, etc.), software, firmware, or a combination thereof. The processing logic can configure the wireless device 100 to operate according to any of the processes described herein. The processing device 104 can communicate with other devices over the wired interfaces, the wireless interfaces, or any combination thereof. The wireless device 100 can also include other components, such as one or more memory devices, additional radios, wired interfaces, or the like.

The impedance detection circuit 102 can include the first RF port 126, the second RF port 128, a first terminal 134 coupled to the first radio 106, and a second terminal 136 coupled to the second radio 108. The switching circuitry is coupled to the first RF port 126, the second RF port 128, the first terminal 134, the second terminal 136, and the bi-directional RF coupler 116. The processing device 104 controls the switching circuitry to i) couple the first terminal 134 to the first port of the bi-directional RF coupler 116, ii) couple the first RF port 126 to the third port of the bi-directional RF coupler 116, iii) couple the second terminal to the second port of the bi-directional RF coupler 116, and iv) decouple the second RF port 128 from the fourth port of the bi-directional RF coupler 116. This can be done in response to the processing device 104 receiving a command from the NOC 130 to put the radios in a coupler mode. The processing device 104 causes the first radio 106 to send a first signal (TX signal) via the first terminal 134. The processing device 104 causes the second radio 108 to measure a first RSSI value of a first reflected signal 138 at the second terminal 136. The first reflected signal 138 is a reflected signal of the first signal (TX signal). The reflected signal 138 is caused by the impedance mismatch at the first RF port 110 because there is no antenna 110. Because there is no antenna 110 at the first RF port 126, there is leakage by the first radio 106. The reflected signal 138 passes from the first RF port 126 through the bi-directional RF coupler 116 from the third port to the second port that is coupled to the second radio 108. The processing device 104 receives the first RSSI value from the second radio 108 and determines that the first RSSI value exceeds the mismatch threshold 132. The processing device sends a message indicative of the impedance mismatch condition to a second device at the NOC 130.

In a further embodiment, the processing device 104 receives a first message from a device at the NOC 130. The first message include a request to check for an impedance mismatch condition caused by i) a first antenna being disconnected from the first RF port 126 or ii) damage to an RF cable between the first antenna and the first RF port 126. In response, the processing device sends a control signal to the switching circuitry to switch from a normal mode to the coupler mode. As described above, in the coupler mode, the switching circuitry i) couples the first radio 106 to the first port of the bi-directional RF coupler 116, the first RF port 126 to the third port of the bi-directional RF coupler 116, and the second radio 108 to the second port of the bi-directional RF coupler 116, and ii) decouples the second RF port 128 from the fourth port of the bi-directional RF coupler 116. In the normal mode, the switching circuitry i) decouples the bi-directional RF coupler 116 from the RF paths and ii) couples the first radio 106 to the first RF port 126 via the first RFFE circuitry 112 and the second radio 108 to the second RF port 128 via the second RFFE circuitry 114. The switching circuitry decouples the bi-directional RF coupler 116 from the RF paths by decoupling the first radio 106, the second radio 108, the first RF port 126, and the second RF port 128.

In the depicted embodiment, the switching circuitry includes the first switch 118 that is coupled to the first terminal 134, the first RFFE circuitry 112, and the first port of the bi-directional RF coupler 116. The switching circuitry includes the second switch 120 that is coupled to the second terminal 136, the second RFFE circuitry 114, and the second port of the bi-directional RF coupler 116. The switching circuitry includes the third switch 122 that is coupled to the first RFFE circuitry 112, the third port of the bi-directional RF coupler 116, and the first RF port 126. The switching circuitry includes the fourth switch 124 that is coupled to the second RFFE circuitry 114, the fourth port of the bi-directional RF coupler 116, and the second RF port 128. The switches 118-124 can be controlled by one or more control signals from the processing device 104 over the switch control interface 105.

In a further embodiment, the processing device 104 causes the second radio 108 to send a second signal via the second terminal 136, such as illustrated and described below with respect to FIG. 1B.

Figure 1B:
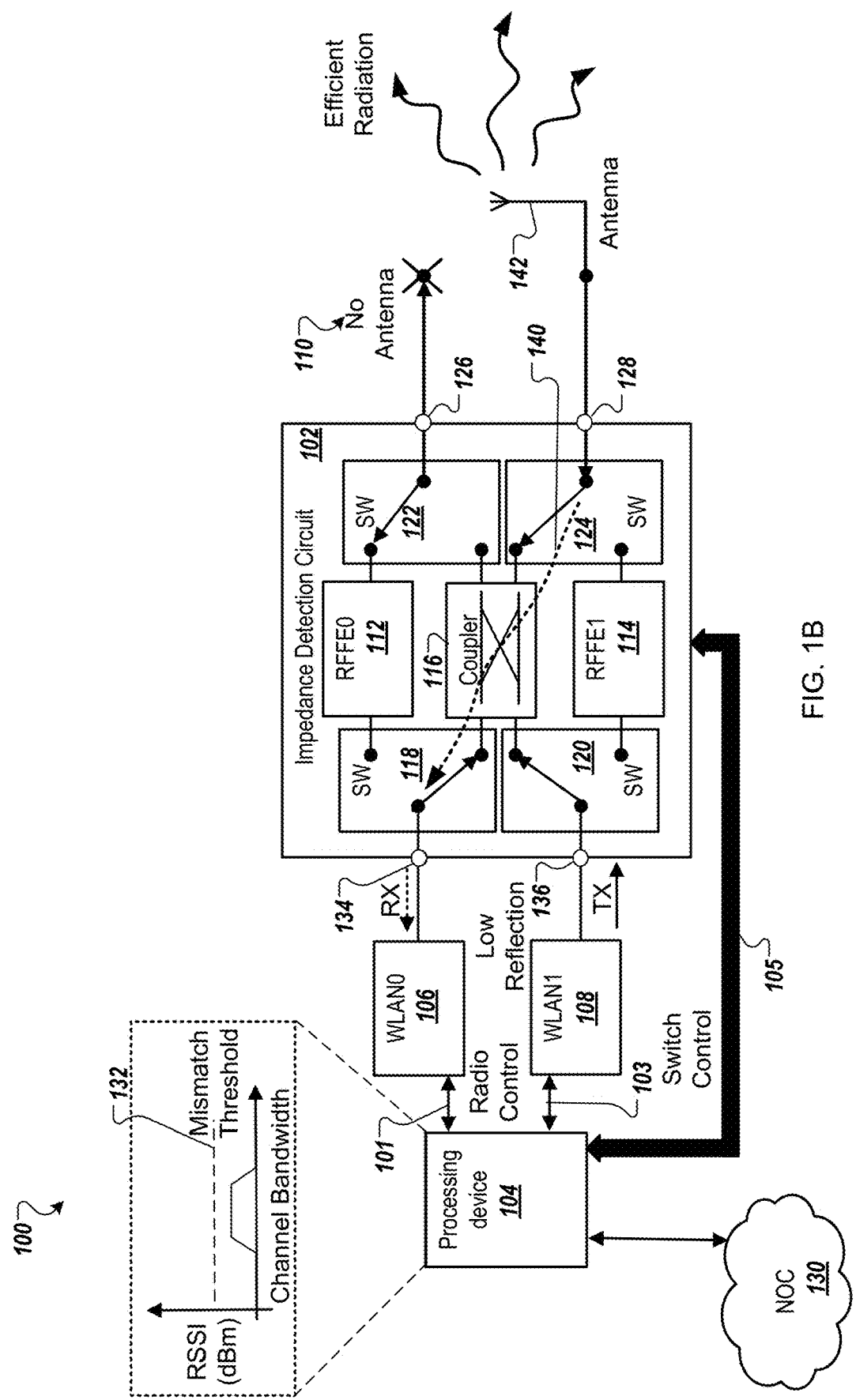
FIG. 1B is a block diagram of the wireless device with the impedance detection circuit where a second radio transmits a second signal according to one embodiment.

FIG. 1B is the block diagram of the wireless device 100 with the impedance detection circuit 102 where the second radio 108 transmits a second signal according to one embodiment. The wireless device 100 in FIG. 1B is similar to the wireless device 100 in FIG. 1A, as noted by the same reference numbers, but the second radio 108 is transmitting instead of the first radio 106. For example, the processing device 104 causes the second radio 108 to send the second signal via the second terminal 136 and causes the first radio 106 to measure a second RSSI value of a second reflected signal 140 at the first terminal 116. The second reflected signal 140 is a reflected signal of the second signal. The processing device 104 receives the second RSSI value from the first radio 106 and determines whether the second RSSI value exceeds the mismatch threshold 132. The mismatch threshold 132 represents the impedance mismatch condition. In this case, the processing device 104 determines that the second RSSI value does not exceed the mismatch threshold 132. When the RSSI value does not exceed the mismatch threshold 132, there is a low reflection between the first radio 106 and the second radio 108. The low reflection is caused because a second antenna 142 is coupled to the second RF port 128 and is well matched. The second antenna 142 may not be perfectly matched, so there can still be the second reflected signal 140 that passes from the second RF port 128 through the bi-directional RF coupler 116 from the fourth port to the first port that is coupled to the first radio 106. The matched antenna load with low reflection causes efficient radiation by the second antenna 142. The matched antenna load with low reflection causes the second reflected signal 140 to be lower than the first reflected signal 138, as well as lower than the mismatch threshold 132. The processing device 104 receives the second RSSI value from the first radio 106 and determines that the second RSSI value does not exceed the mismatch threshold 132. In one embodiment, the processing device 104 sends a message with an indication that there is not an impedance mismatch condition at the second RF port 128. In another embodiment, the processing device 104 determines the impedance mismatch condition when the first RSSI value exceeds the mismatch threshold 132 and the second RSSI value does not exceed the mismatch threshold 132. That is, the processing device 104 can send the indication of the impedance mismatch condition to the second device at the NOC 130 responsive to the first RSSI value exceeding the threshold and the second RSSI value not exceeding the threshold. As described above, the impedance mismatch condition is caused by i) a first antenna being disconnected from the first RF port 126 (i.e., no antenna 110) or ii) a physical attribute of an RF cable that is coupled between the first antenna and the first RF port 126. The physical attribute can be a damaged portion of the RF cable, poor shielding, or the like.

It should be noted that there is very little reflected energy coupled to the first radio 106 when the second radio 108 is properly impedance matched by the second antenna 140, as shown in FIG. 1B. The difference in RSSI between matched and mismatched can be set to be in the tens of dB at the receiving radio. An RSSI threshold condition may be set in software based on calibration measurements at the factory.

As illustrated in FIGS. 1A-1B, the impedance detection circuit 102 can be used to detect an impedance mismatch condition using the two radios: first radio 106 and second radio 108. In other embodiments, the wireless device 100 includes one or more additional radios and the switching circuitry of the impedance detection circuit 102 can connect the bi-directional RF coupler 116 between any pair of the three or more radios. Alternatively, the processing device 104 can control the switching circuitry in other manners to transmit a signal and measure an RSSI value at each of the other radios, for example.

Figure 2:
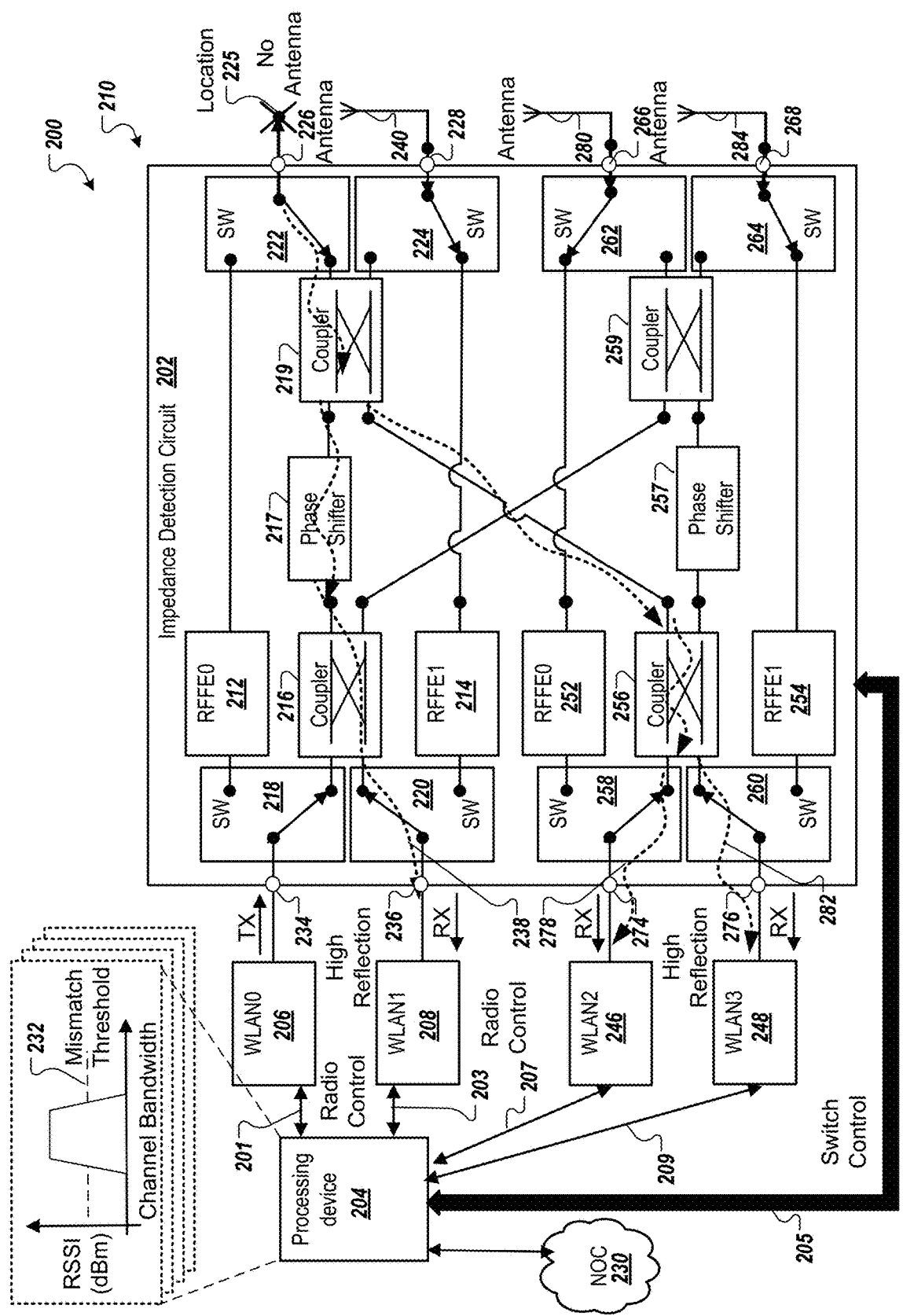
FIG. 2 is a block diagram of a wireless device 200 with an impedance detection circuit 202 with a butler matrix according to one embodiment.

The technology described above with respect to two antennas can be implemented to devices with more than two concurrent radios. In one embodiment, each pair of radios uses the same impedance detection circuit described above. In another embodiment, all radios can be coupled through a Butler matrix, as described below. In a four-radio example, such as illustrated in FIG. 2, a single RF port is routed to the Butler matrix using an RF switch. All other RF ports are disconnected from the Butler matrix. Cascaded hybrid couplers are used to distribute the reflected signals to all radios in receive mode. Each radio can receive a similar RSSI level, which can be compared, averaged, or otherwise processed in parallel to determine whether there is an impedance mismatch condition at an RF port.

In one embodiment, the processing device 104 controls the first radio 106 to be coupled to the first terminal 134 during a first time period and during a second time period. The processing device 104 controls the second radio 108 to be coupled to the second terminal 136 during the first time period and a third radio (not illustrated in FIGS. 1A-1B) to be coupled to the second terminal 136 during the second time period. During the first time period, the processing device 104 causes the first radio to send a third signal and causes the second radio to measure a third RSSI value of a third reflected signal at the second terminal 136. During the second time period, the processing device 104 causes the first radio to send a fourth signal and causes the third radio to measure a fourth RSSI value of a fourth reflected signal at the second terminal 136. The processing device 104 receives the third RSSI value from the second radio and the fourth RSSI value from the third radio. The processing device 104 determines whether the third RSSI value or the fourth RSSI value exceed the mismatch threshold 132. The processing device sends one or more indications of any impedance mismatch conditions to the device at the NOC 130. For example, the impedance mismatch condition is caused by a first antenna not being connected to the first RF port 126 or damage to the RF cable. Alternatively, the impedance mismatch condition can be caused by a second antenna not being connected to the second RF port 128. In another embodiment, the first radio sends the third signal and both the second radio and the third radio each receive a reflected signal and each measure a RSSI value.

In another embodiment, the first radio is coupled to the first terminal during a first time period, the second radio is coupled to the second terminal during the first time period, a third radio is coupled to the first terminal during a second time period, and a fourth radio is coupled to the second terminal during the second time period. The processing device 104, during the first time period, causes the first radio to send the first signal and causes the second radio to measure the first RSSI value. The processing device 104, during the second time period, causes the third radio to send a second signal and causes the fourth radio to measure a second RSSI value of a second reflected signal at the second terminal. The processing device 104 receives the second RSSI value from the fourth radio and determines that the second RSSI value exceeds the mismatch threshold. The processing device sends a second indication of a second impedance mismatch condition to the second device responsive to the second RSSI value exceeding the threshold. The impedance mismatch condition can be caused by i) a first antenna being disconnected from the first RF port during the first time period or ii) damage to an RF cable that is coupled between the first antenna and the first RF port during the first time period. In this embodiment, the second antenna is connected to the second RF port during the first time period. The second impedance mismatch condition can be caused by i) a third antenna being disconnected from the first RF port during the second time period or ii) damage to a second RF cable that is coupled between the third antenna and the first RF port during the second time period. In this case, a fourth antenna is connected to the second RF port during the second time period.

In another embodiment, the switching circuitry includes a butler matrix, such as illustrated and described with respect to FIG. 2.

FIG. 2 is a block diagram of a wireless device 200 with an impedance detection circuit 202 with a butler matrix according to one embodiment. The wireless device 200 includes a processing device 204, a first radio 206, a second radio 208, a third radio 246, a fourth radio 248, and the impedance detection circuit 202. In general, the impedance detection circuit 202, under control by the processing device 204, is used to measure one or more RSSI values of one or more reflected signals, the reflected signals being caused by an impedance mismatch condition caused by an antenna being disconnected from a first RF port 226 (labeled as "no antenna 210) or vi) damage to an RF cable coupled between the antenna and the first RF port 226 (not illustrated in FIG. 2).

In the depicted embodiment, the first radio 206 is a first WLAN radio, the second radio 208 is a second WLAN radio, the third radio 246 is a third WLAN radio, and the fourth radio 248 is a fourth WLAN radio, each of which is capable of co-channel operation. The first radio 206 is coupled to the processing device 204 and the processing device 204 can control the first radio 206 over a first radio control interface 201. The second radio 208 is coupled to the processing device 204 and the processing device 204 can control the second radio 208 over a second radio control interface 203. The third radio 246 is coupled to the processing device 204 and the processing device 204 can control the third radio 246 over a third radio control interface 207. The fourth radio 248 is coupled to the processing device 204 and the processing device 204 can control the fourth radio 248 over a fourth radio control interface 209. The impedance detection circuit 202 is coupled to the processing device 204 and the processing device 204 can control the impedance detection circuit 202 over a switch control interface 205. The impedance-detector circuit 202 includes a first RFFE circuitry 212, second RFFE circuitry 214, third RFFE circuitry 252, fourth RFFE circuitry 254, the butler matrix, and switching circuitry, including a first switch 218, a second switch 220, a third switch 222, a fourth switch 224, a fifth switch 258 coupled to a third terminal 274, a sixth switch 260 coupled to a fourth terminal 276, a seventh switch 262 coupled to a third RF port 266, and an eighth switch 264 coupled to a fourth RF port 268, as set forth in the depicted embodiment. The switches 218-224 and 258-264 can be controlled by one or more control signals from the processing device 204 over the switch control interface 205. It should be noted that other configurations of switches can be used for the switching circuitry of the impedance detection circuit 202.

As illustrated in the depicted embodiment, the butler matrix includes: a i) bi-directional RF coupler 216 that includes a first port, a second port, a third port, and a fourth port; ii) a second bi-directional RF coupler 256 that includes a first port, a second port, a third port, and a fourth port; iii) a first phase shifter 217; iv) a second phase shifter 257; v) a third bi-directional RF coupler 219; and vi) a fourth bi-directional RF coupler 259.

In one embodiment, the switching circuitry, in a coupler mode, i) couples the first radio 206 to the first port of the first bi-directional RF coupler 216 via the first switch 218, a first RF port 226 to the third port of the first bi-directional RF coupler 216 via the first phase shifter 217, the third bi-directional RF coupler 219, and the second switch 222. In the coupler mode, the switching circuitry also ii) couples the second radio 2018 to the second port of the first bi-directional RF coupler 216 via the second switch 220, and the second radio 208 to the second port, and iii) decouples a second RF port 228 from the fourth port of the third bi-directional RF coupler 219. The fourth port of the first bi-directional RF coupler 216 is coupled to a first port of the fourth bi-directional RF coupler 259. A third port of the second bi-directional RF coupler 256 is coupled to a second port of the third bi-directional RF coupler 219. In the coupler mode, the switching circuitry also iv) couples the third radio 246 to the first port of the second bi-directional RF coupler 256 via the fifth switch 258. The switching circuitry also v) decouples a third RF port 266 from the second port of the fourth bi-directional RF coupler 259 and a fourth RF port 268 from a fourth port of the fourth bi-directional RF coupler 259.

The switching circuitry, in a normal mode, i) decouples the first bi-directional RF coupler 216, the second bi-directional RF coupler 256, the third bi-directional RF coupler 219, and the fourth bi-directional RF coupler 259 from each of the radios and each of the RF ports; and ii) couples each of the respective RFFE circuitry 212, 214, 252, and 254 to each of the radios 206, 208, 246, and 248, respectively and to each of the RF ports 226, 228, 266, and 268, respectively.

In the normal mode, the processing device 204 can receive a first message from a device at a NOC 230. The first message can include a request to check for an impedance mismatch condition caused by the first antenna being disconnected from the first RF port (no antenna 210) or vi) damage to an RF cable coupled between the first antenna and the first RF port 226. The processing device 204 sends a control signal over the switch control interface 205 to the impedance detection circuit 202 that causes the impedance detection circuit 202 to switch from the normal mode to the coupler mode as set forth above. The processing device 204 instructs the first radio 206 over the first radio control interface 201 to send a first signal via the first RF port 226. The processing device 204 instructs the second radio 208 over the second radio control interface 203 to measure a first RSSI value of a first reflected signal 238 at the second port of the first bi-directional RF coupler 216. The processing device 204 instructs the third radio 246 over the third radio control interface 207 to measure a second RSSI value of a second reflected signal 278 at the first port of the second bi-directional RF coupler 256. The processing device 204 instructs the fourth radio 248 over the fourth radio control interface 209 to measure a third RSSI value of a third reflected signal 282 at the second port of the second bi-directional RF coupler 256. The first reflected signal 238, the second reflected signal 278, and the third reflected signal 282 are caused by an impedance mismatch condition caused by the first antenna not being coupled to the first RF port 226 ("no antenna" 210) or damage to an RF cable coupled between the first antenna and the first RF port 226.

The processing device 204 receives the first RSSI value from the second radio 208, the second RSSI value from the third radio 246, and the third RSSI value from the fourth radio 248. The processing device 204 determines whether each of the first, second, and third RSSI values exceed a mismatch threshold 232. The mismatch threshold 232 represents the impedance mismatch condition. When an RSSI value exceeds the mismatch threshold 232, there is a high reflection between the receiving radio and the transmitting radio. The high reflection causes the reflected signals, as well as leakage at the first RF port 226. Responsive to the processing device determining that one or more of the RSSI values exceed the mismatch threshold 232, the processing device 204 sends a second message to the device at the NOC 230. The second message includes a response with the impedance mismatch condition detected (e.g. information that identifies the first antenna not being coupled to the first RF port 226 ("no antenna" 210) or damage to an RF cable coupled between the first antenna and the first RF port 226).

Figure 5:
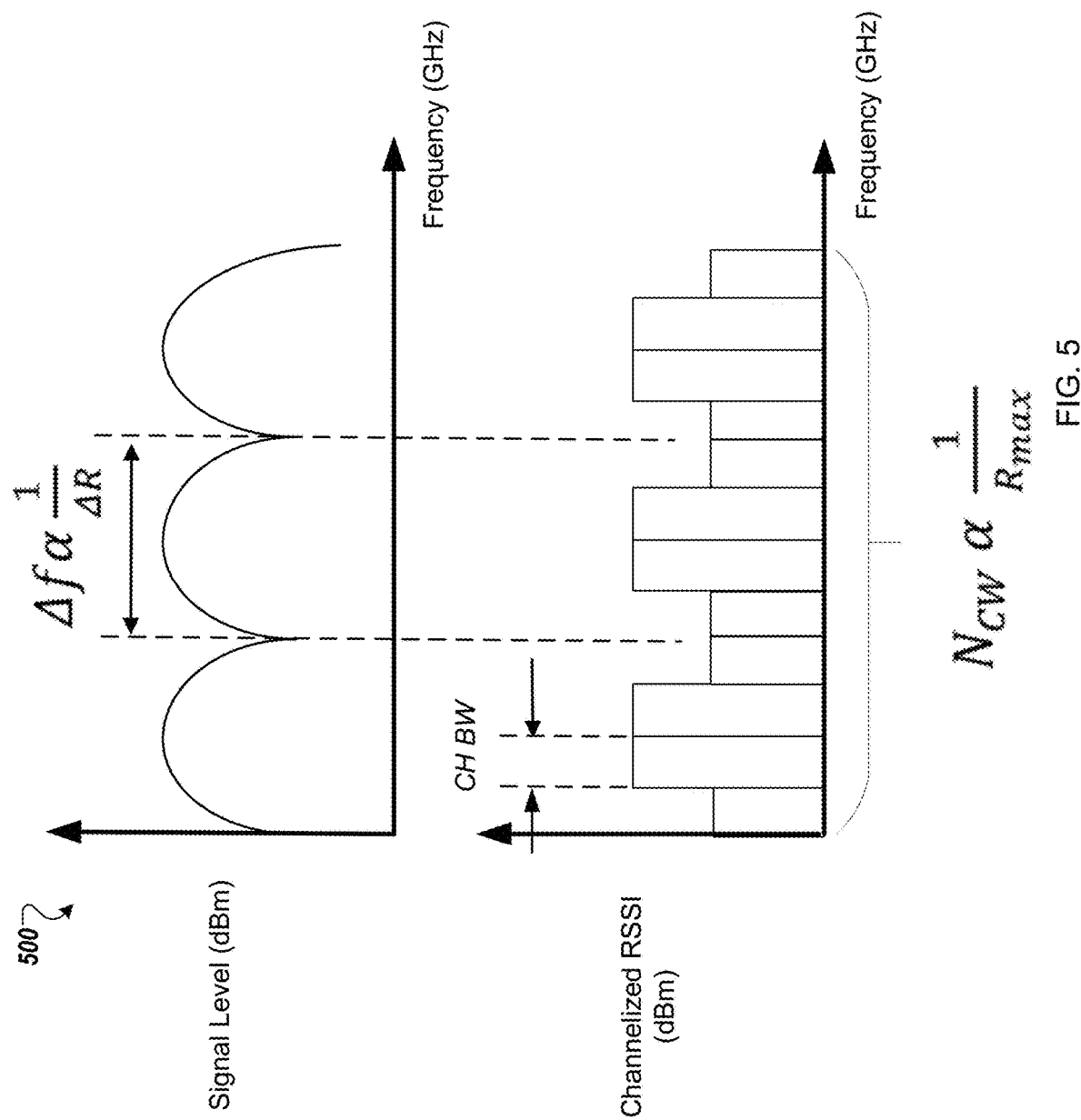
FIG. 5 illustrates a frequency domain reflectometer visualization of the bi-directional RF coupler according to one embodiment.

In other embodiments, the processing device 204 can control transmissions by the first radio 206 over a set of channels in a frequency-domain reflectometry mode. In the frequency-domain reflectometry mode, the processing device can determine a physical distance of the mismatch impedance condition using the RSSI values over the set of channels. As described herein, the physical distance is between an RF port 226 and a location 225 where the impedance mismatch condition occurs. The processing device 204 can receive a command that instructs the processing device 204 to enter the frequency-domain reflectometry mode after determining that an impedance mismatch condition is detected. In the frequency-domain reflectometry mode, the processing device 204 can perform a channel sweep and measure RSSI measurements of the reflected signals during the channel sweep. The processing device computes a reflection distance using the RSSI measurements, such as illustrated in FIG. 5, the reflection distance being between the RF port and a location where the impedance mismatch condition occurs. The processing device 204 sends a third message to the device at the NOC 230. The third message includes the physical distance of the impedance mismatch condition. The physical distance can also be reported in the second message described above that includes the impedance mismatch condition.

Like the processing device 104, the processing device 204 can include one or more CPUs, microcontrollers, field programmable gate arrays, or other types of processors or processing devices. The processing device 204 can implement processing logic that comprises hardware (e.g., circuitry, dedicated logic, programmable logic, microcode, etc.), software, firmware, or a combination thereof. The processing logic can configure the wireless device 200 to operate according to any of the processes described herein. The processing device 204 can communicate with other devices over the wired interfaces, the wireless interfaces, or any combination thereof. The wireless device 200 can also include other components, such as one or more memory devices, additional radios, wired interfaces, or the like.

In other embodiments, the processing device 204 can check each of the other RF ports 228, 266, and 268 in a similar fashion as the first RF port 226 as described above. In those embodiments, the processing device 204 sends different control signals to the respective radios to transmit and receive and measure the RSSI values of the reflected signals. The processing device 204 determines whether the impedance mismatch conditions occur on the respective RF port using the measured RSSI values. Similarly, the processing device 204 can determine a physical distance in the frequency-domain reflectometry modes for each of the RF ports.

In one embodiment, the switching circuitry of the impedance detection circuit 202 includes: the first switch 218 that is coupled to the first terminal 234, the first RFFE circuitry 212 and the first port of the first bi-directional RF coupler 216; the second switch 220 that is coupled to the second terminal 236, the second RFFE circuitry 214 and the second port of the first bi-directional RF coupler 212; the third switch 222 that is coupled to the first RFFE circuit 212, the first RF port 226, and a third port of the third bi-directional RF coupler 219, a first port of the third bi-directional RF coupler 219 being coupled to a second port of the first bi-directional RF coupler 216 via a first phase shifter 217; the fourth switch 224 that is coupled to a fourth port of the second bi-directional RF coupler 256, the second RF port 228, and the second RFFE circuitry 214; the fifth switch 258 that is coupled to a third terminal 274, the third RFFE circuitry 252, and a first port of the second bi-directional RF coupler 256; the sixth switch 260 that is coupled to a fourth terminal 276, a fourth RFFE circuitry 254, and a second port of the second bi-directional RF coupler 256, a third port of the second bi-directional RF coupler 256 being coupled to a second port of the third bi-directional RF coupler 219; the seventh switch 262 that is coupled to the third RFFE circuitry 252, a third RF port 266, and a second port of a fourth bi-directional RF coupler 259, a first port of the fourth bi-directional RF coupler 259 being coupled to a fourth port of the first bi-directional RF coupler 216 and a second port of the fourth bi-directional RF coupler 259 being coupled to a fourth port of the second bi-directional RF coupler 256 via a second phase shifter 257; and the eighth switch 265 that is coupled to a fourth port of the fourth bi-directional RF coupler 259, a fourth RF port 268, and the fourth RFFE circuitry 254. The processing device 204 can control the switching circuitry to be in this configuration for a coupled mode. The processing device 204 can control the switching circuitry to switch between a normal mode and the coupled mode. In the normal mode, each of the respective RFFE circuitry is switched between a terminal and an RF port, removing the bi-directional RF couplers and the phase shifters out of the RF paths.

In a first mode, the processing device 204 can determine RSSI values and an impedance mismatch condition using a RSSI-based impedance detection algorithm. In a second mode (e.g., frequency-domain reflectometry mode), the processing device can determine RSSI values and a physical distance of the impedance mismatch condition using a RSSI-based frequency-domain reflectometry algorithm. In the second mode, the processing device 204 can cause the first radio 206 to i) send a set of signals, including the first signal, and ii) cause the second radio to measure a first set of RSSI values, including the first RSSI value, the third radio to measure a second set of RSSI values, and the fourth radio to measure a third set of RSSI values, wherein each of the set of signals has a different frequency of a channel. Each of the first set of RSSI values corresponds to each of the different frequencies of the channel. Each of the second set of RSSI values corresponds to each of the different frequencies of the channel. Each of the third set of RSSI values corresponds to each of the different frequencies of the channel. The processing device 204 determines a reflection distance to a location where the impedance mismatch condition occurs, such as at or beyond the first RF port, using the first set of RSSI values, the second set of RSSI values, and the third set of RSSI values. The processing device sends a value representing the reflection distance to the second device at the NOC 230.

Figure 3:
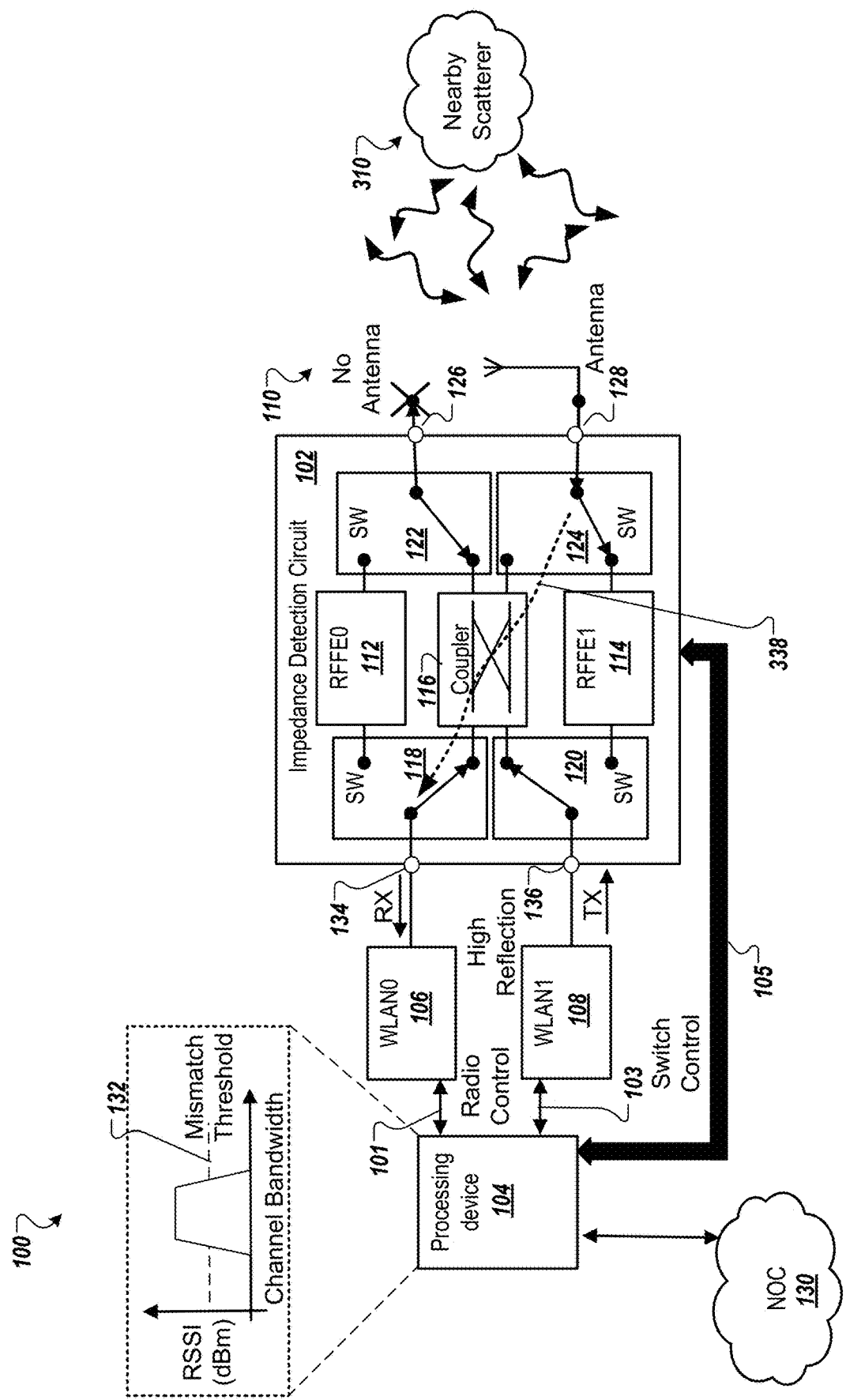
FIG. 3 is a block diagram of a wireless device with an impedance detection circuit in a frequency domain reflectometry mode according to one embodiment.

As described herein, the impedance detection circuit can operate as a frequency domain reflectometer (also referred to herein as operating in a "frequency domain reflectometry" mode). The RSSI level can be used to determine the level of reflected energy from a particular RF port. However, this information alone does not indicate a physical distance (e.g., a location) of the impedance mismatch. For example, the impedance mismatch condition may actually be due to reflections from scatterers near an antenna, such as illustrated in FIG. 3. A nearby scatterer is a nearby object that refracts or diffracts electromagnetic radiation irregularly to diffuse in many directions. Once the physical distance is determined by the wireless device in the frequency domain reflectometry mode, the wireless device can send this information to the NOC. There are circumstances where it will be useful at the NOC to know if signal degradation is occurring at the RF ports or beyond the antenna.

FIG. 3 is a block diagram of the wireless device 100 with the impedance detection circuit 102 in a frequency domain reflectometry mode according to one embodiment. The wireless device 100 is similar to the wireless device 100 described above with respect to FIGS. 1A-1B, as noted by similar components with the same reference numbers. In the frequency domain reflectometry mode, the processing device 104 can measure RSSI values of reflected signals duce to a nearby scatter 310. As illustrated in FIG. 3, the first radio 134 can measure a signal 338 that passes through the bi-directional RF coupler 116 from the second RF port 128. The signal 338 can be representative of reflection caused by the nearby scatterer 310. The RSSI values measured in the frequency domain reflectometry mode can be used to determine a physical location of the impedance mismatch condition from frequency spacing between reflection nulls. The coupler-based frequency domain reflectometer shown in FIG. 3 can rely on constructive and destructive interference between reflected and coupled signals, such as illustrated and described below with respect to FIG. 4.

Figure 4:
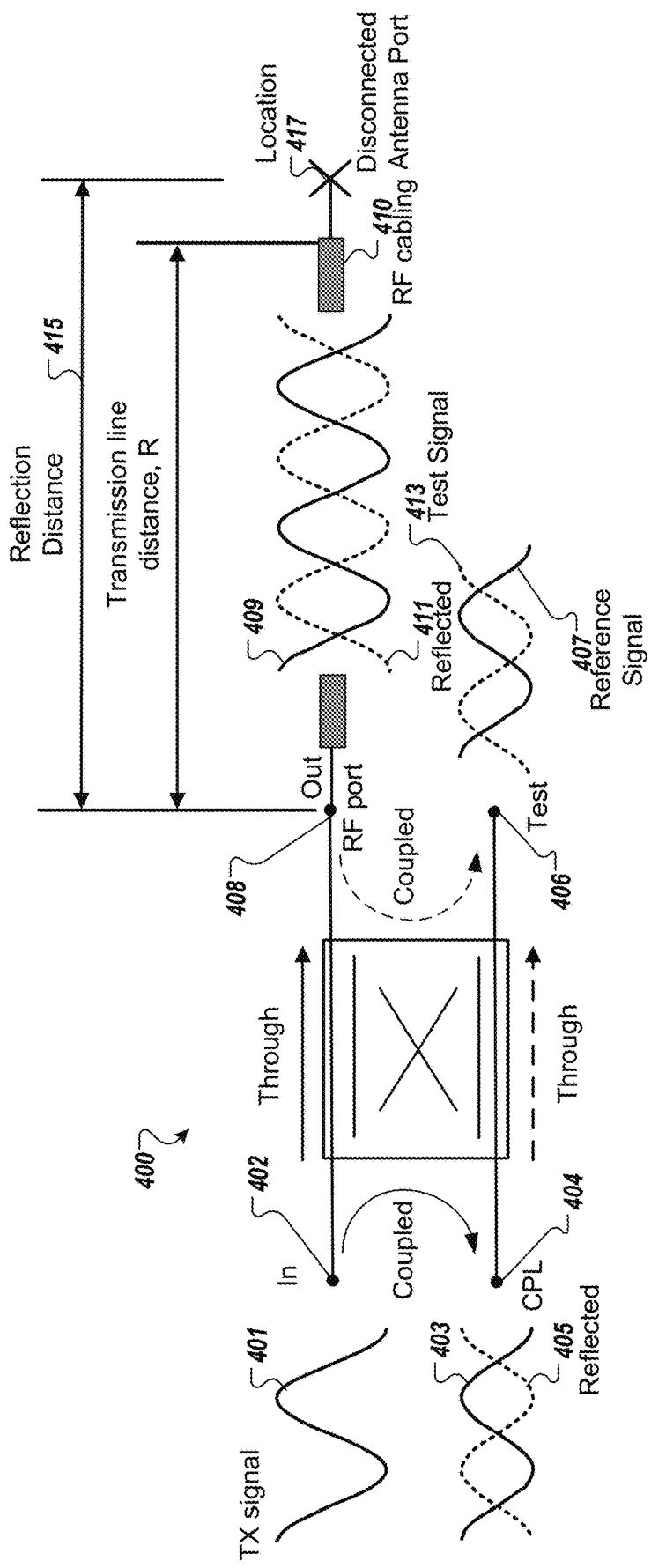
FIG. 4 illustrates operation of a bi-directional RF coupler in a frequency domain reflectometry mode according to one embodiment.

FIG. 4 illustrates operation of a bi-directional RF coupler 400 in a frequency domain reflectometry mode according to one embodiment. The bi-directional RF coupler 400 in the frequency domain is similar to the bi-directional RF couplers described herein, such as the bi-directional RF coupler 102 of FIGS. 1A-1B. The bi-directional RF coupler 400 relies on constructive and destructive interference between reflected and coupled signals. An incident transmitted signal 401, at a first input port 402, is coupled to an unmatched coupler port (CPL) 404 and is used as a reflectometer reference signal 403. The open circuit impedance mismatch reflects a reflected signal 405 through the bi-directional RF coupler 400 to a test port 406 (TEST). A reference signal level 407 is equal to the transmit power of the incident transmitted signal 401 minus a coupling coefficient (i.e. 10 dB coupler) and insertion losses. The incident-transmitted signal 401 is routed through the bi-directional coupler 400 to an antenna port 408 as a test signal 409. Depending on antenna port impedance, some of the test signal 409 is reflected back toward the bi-directional RF coupler 400 as a reflected test signal 411. The reflected test signal 411 is then coupled to the test port 406 as a test signal 413 and combined with the reference signal 407. This produces frequency domain nulls whenever the test signal 413 and reference signal 407 are out of phase by 180 degrees (180°), as illustrated in FIG. 5.

As described herein, the bi-directional RF coupler 400 in a frequency domain reflectometry mode can determine a reflection distance 415 between the RF port 408 and a location 417 where the impedance mismatch condition occurs. Here, the impedance mismatch condition occurs at location 417 because of a disconnected antenna port. In other cases, the location 417 could be at other locations along the transmission line (RF cabling 410) between the RF port 408 and the antenna port due to some physical attribute that causes malfunction of the RF cabling 410.

FIG. 5 illustrates a frequency domain reflectometer visualization 500 of the bi-directional RF coupler 400 of FIG. 4 according to one embodiment. The test signal 413 accumulates phase as it propagates along RF cabling 410 in both forward (incident) and reverse directions (reflection). For simplicity, assume the phase of the reference signal 407 at the test port 406 is 0°. Nulls will occur when the phase difference equals an odd multiple of 180° as set forth in equation (1):

$$\varphi_n = \varphi_t - \varphi_r = (2n-1)\pi-, \tag{1}$$

where $\varphi_t$ is the test signal phase, $\varphi_r = 0°$ is the reference signal phase and n=1, 2, 3, . . . .

The phase difference in terms of propagation coefficient and distance are set forth in equations (2) and (3):

$$\beta_n = \frac{4\pi f_n}{v_p} \tag{2}$$

$$\varphi_n = 2\beta_n R = (2n-1)\pi \tag{3}$$

Differentiating with respect to n and solving for distance R gives the simple relation between null spacing and distance to impedance mismatch, as set forth in equation (4):

$$R = \frac{v_p}{(2\pi \Delta f)} \tag{4}$$

where $v_p$ is the phase velocity of the transmission line.

Minimum distance resolution for this reflectometer type is expressed in equation (5):

$$\Delta R(m) = (1.5 \times 10^8)\frac{V_p}{BW} \quad (5)$$

where $v_p$ is the phase velocity of the transmission line and the BW is the total bandwidth available.

The maximum detectable range is expressed in equation (6):

$$R(m) = N \times \Delta R \quad (6)$$

where N is the number of sample points within the available bandwidth.

For example, consider the approximate frequency spectrum (e.g., ~600 MHz) in the 5.170 to 5.825 GHz U-NII band. Assuming a phase velocity, $v_p$=0.7, the minimum detectable distance is ≈0.2 m. Maximum distance detection is ≈20 m when measured on approximately one-hundred 5 MHz channels. The difference between disconnected antenna (<5 m) and nearby reflections (>5 m) are both detectable within this range.

Figure 6A:
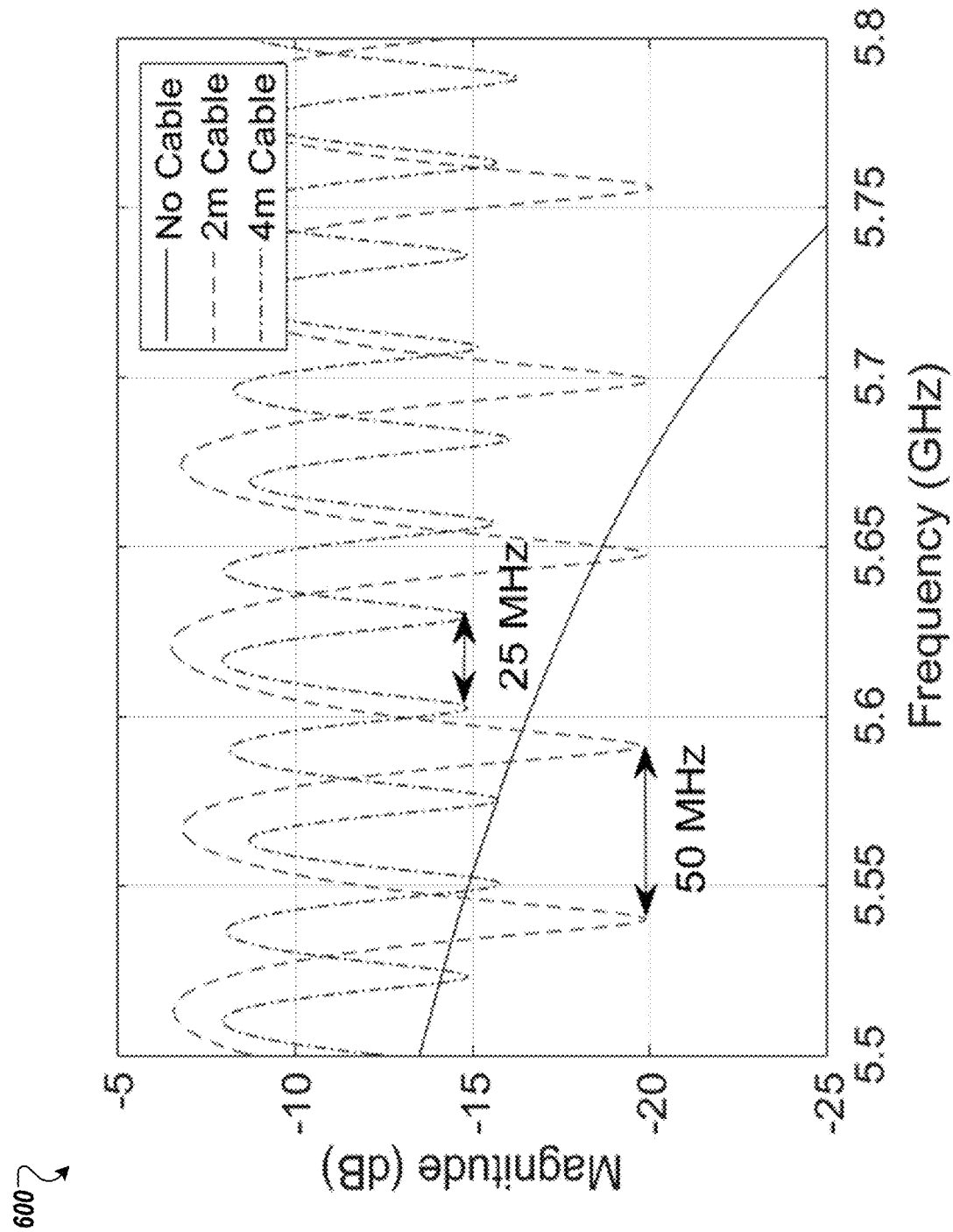
FIG. 6A is a graph of S-parameter measurements for a bi-directional coupler according to one embodiment.

FIG. 6A is a graph 600 of S-parameter measurements for a bi-directional coupler according to one embodiment. The graph 600 shows the measured null spacing for different unterminated antenna port cable lengths. For example, a 2-meter cable sample has 50 MHz null spacing. This result scales to the predicted 20 meters maximum cable length when measured using 5 MHz channels. One interesting observation is that the null depths decrease as cable length increases. This is because the reflected test signal amplitude reduces as the cable loss increases. The reference signal remains unchanged resulting in partial signal cancellation at the test port. One method to improve the null depth is to match the test and reference signal amplitudes using an attenuator at the coupler (CPL) port. A 5 dB improvement in null depth is shown in FIG. 6B.

Figure 6B:
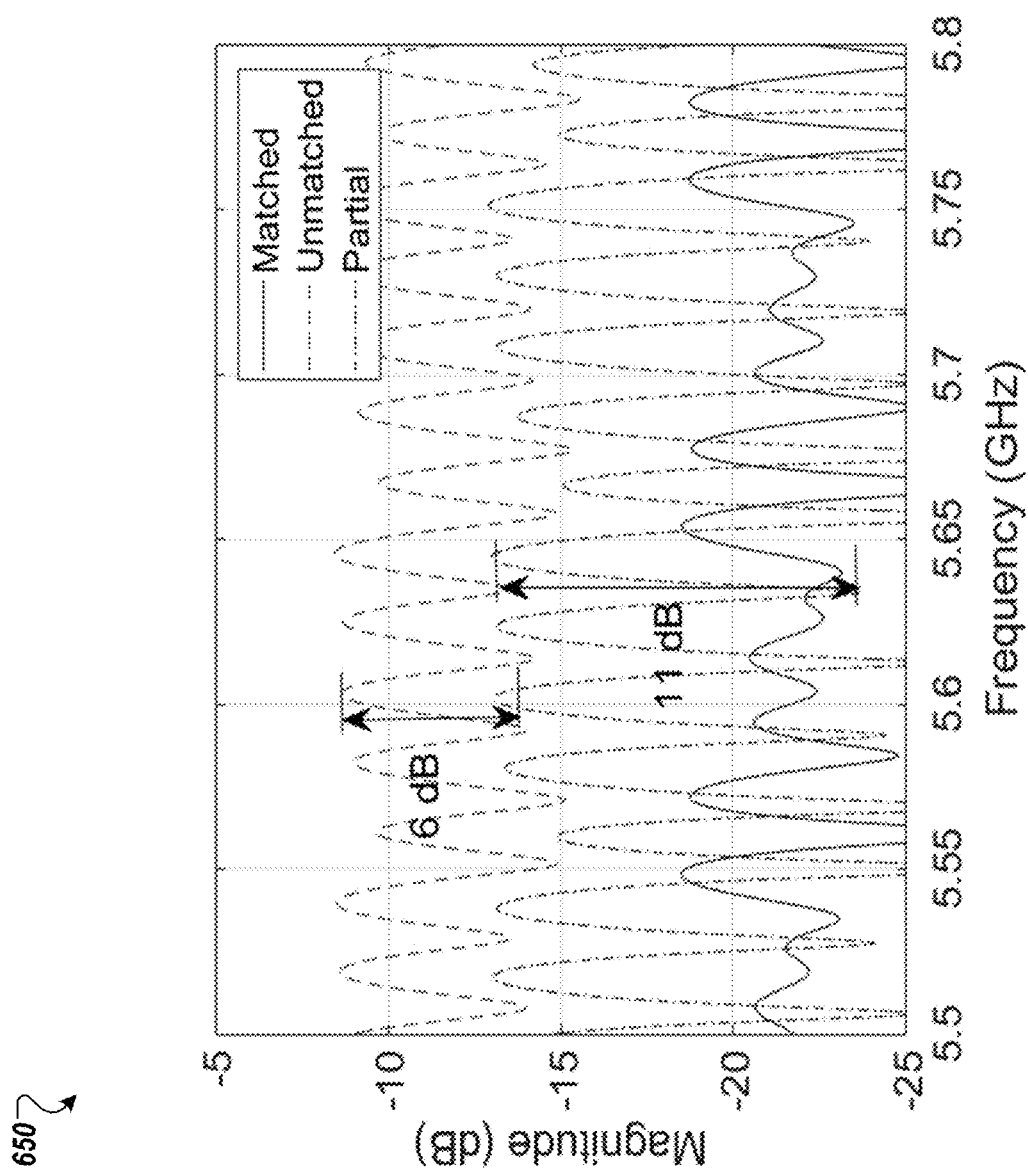
FIG. 6B is a graph of S-parameter measurements for a bi-directional coupler with an attenuator at a coupler (CPL) port according to one embodiment.

FIG. 6B is a graph 650 of S-parameter measurements for a bi-directional coupler with an attenuator at a coupler (CPL) port according to one embodiment. The graph 650 shows the null depth dependence on CPL port impedance load.

In addition to operating as a frequency domain reflectometer, the impedance detection circuit can be used in a multi-mode port impedance circuit, as described and illustrated below with respect to FIGS. 7-8. RSSI and reflectometer functionality require different CPL port terminations. For example, RSSI level measurements have flat frequency response and highest accuracy when CPL port is match terminated. In contrast, reflectometry is best suited with a reflective (open or short circuit) or partial attenuation at the CPL port. Therefore, a modified impedance detection circuit may be used. In this embodiment, a pair of reflective RF switches (SW_R) is added to the impedance detection circuit as shown and described below with respect to FIG. 7 and FIG. 8. This allows the CPL port to be switched between RSSI (matched CPL load) and reflectometry (reflective or partially attenuated CPL load).

Figure 7:
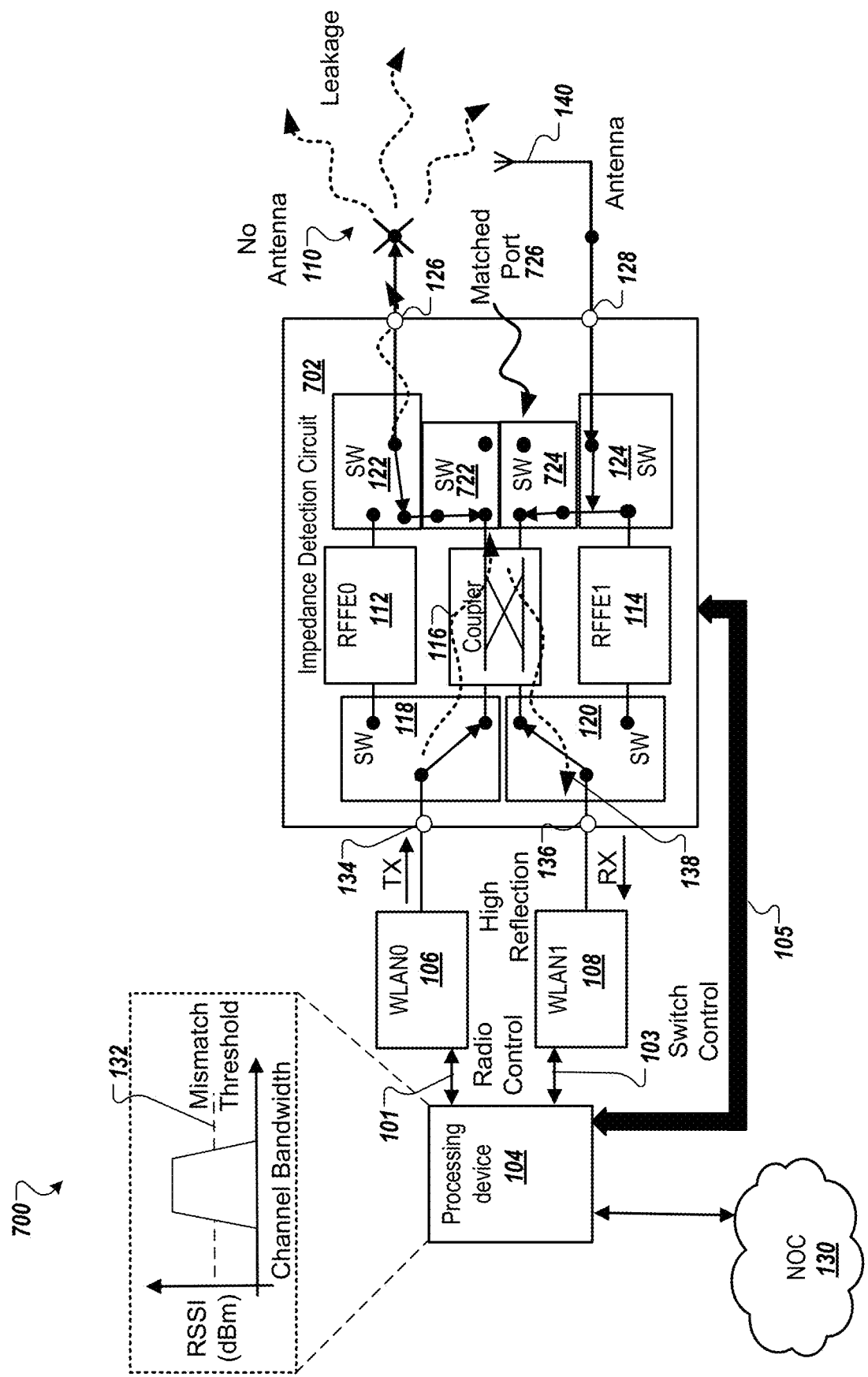
FIG. 7 is a block diagram of a wireless device with impedance detection circuit with a pair of reflective RF switches (SW_R) in an RSSI mode according to one embodiment.

FIG. 7 is a block diagram of a wireless device 700 with an impedance detection circuit 702 with a pair of reflective RF switches (SW_R) 722, 724 in an RSSI mode according to one embodiment. The wireless device 700 is similar to the wireless device 700 described above with respect to FIGS. 1A-1B, as noted by similar components with the same reference numbers. The impedance detection circuit 702 is similar to the impedance detection circuit 102 described above with respect to FIGS. 1A-1B, as noted by similar components with the same reference numbers. In the RSSI mode, the processing device 104 controls the pair of reflective RF switch 722, 724. In particular, the processing device 104 connects the reflective switch 722 between the second port of the bi-directional RF coupler 116 and the third switch 122, which is coupled to the first RF port 126. The processing device 104 connects the reflective switch 724 between the fourth port of the bi-directional RF coupler 116 and the fourth switch 124, which is coupled to the second RF port 126. The reflective switch 724 is coupled to a matched port 726, causing a matched CPL load on the bi-directional RF coupler 116.

Figure 8:
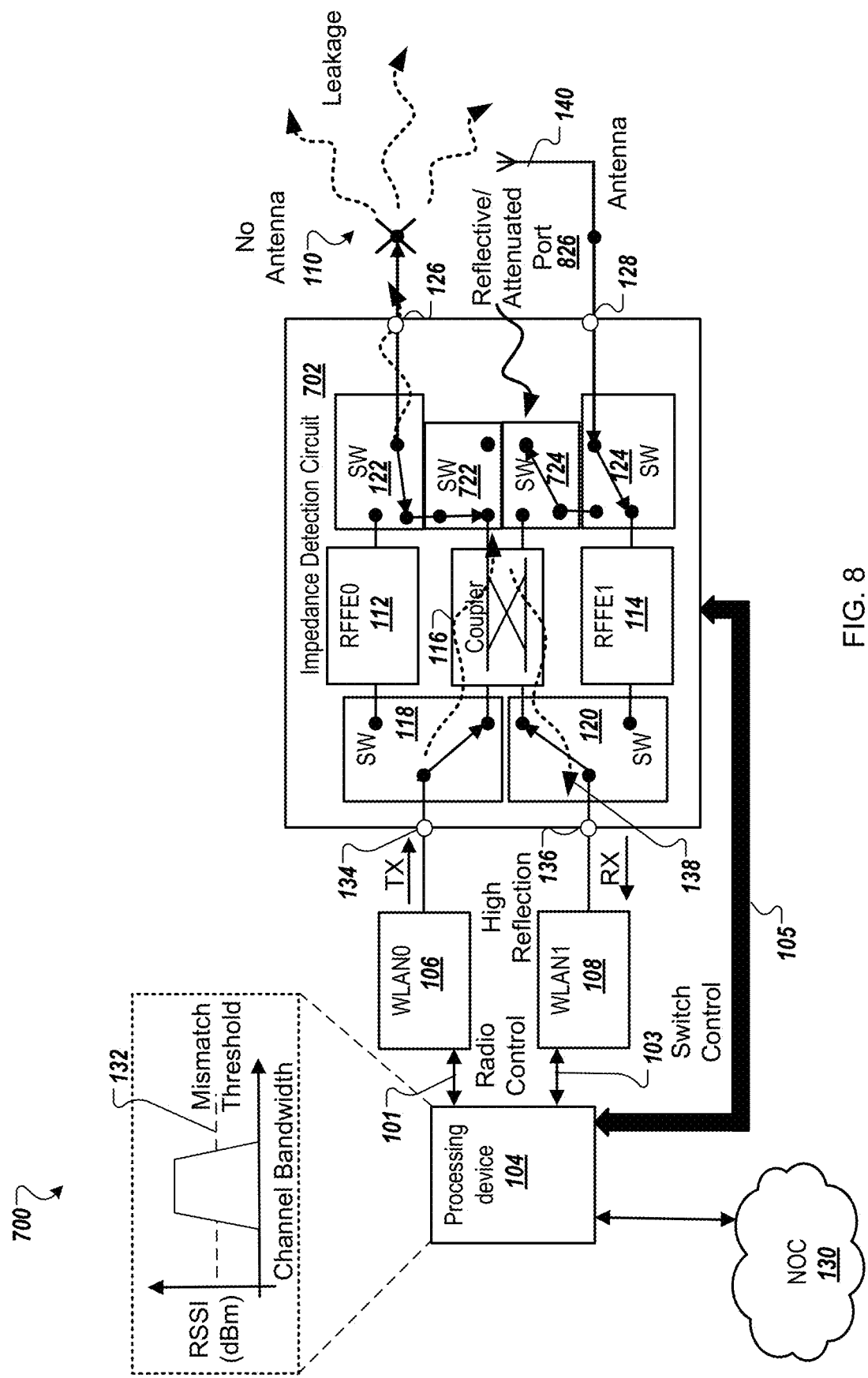
FIG. 8 is a block diagram of a wireless device with an impedance detection circuit with a pair of reflective RF switches (SW_R) in a reflectometry mode according to one embodiment.

FIG. 8 is a block diagram of the wireless device 700 with the impedance detection circuit 702 with a pair of reflective RF switches (SW_R) in a reflectometry mode according to one embodiment. In the frequency domain reflectometry mode, the processing device 104 connects the reflective switch 722 between the second port of the bi-directional RF coupler 116 and the third switch 122, which is coupled to the first RF port 126. The processing device 104 connects the reflective switch 724 between the fourth port of the bi-directional RF coupler 116 and the fourth switch 124, which is coupled to the second RF port 126. The reflective switch 724 is coupled to a reflective/attenuated port 826, causing a reflective or partially attenuated CPL load CPL load on the bi-directional RF coupler 116.

Figure 9:
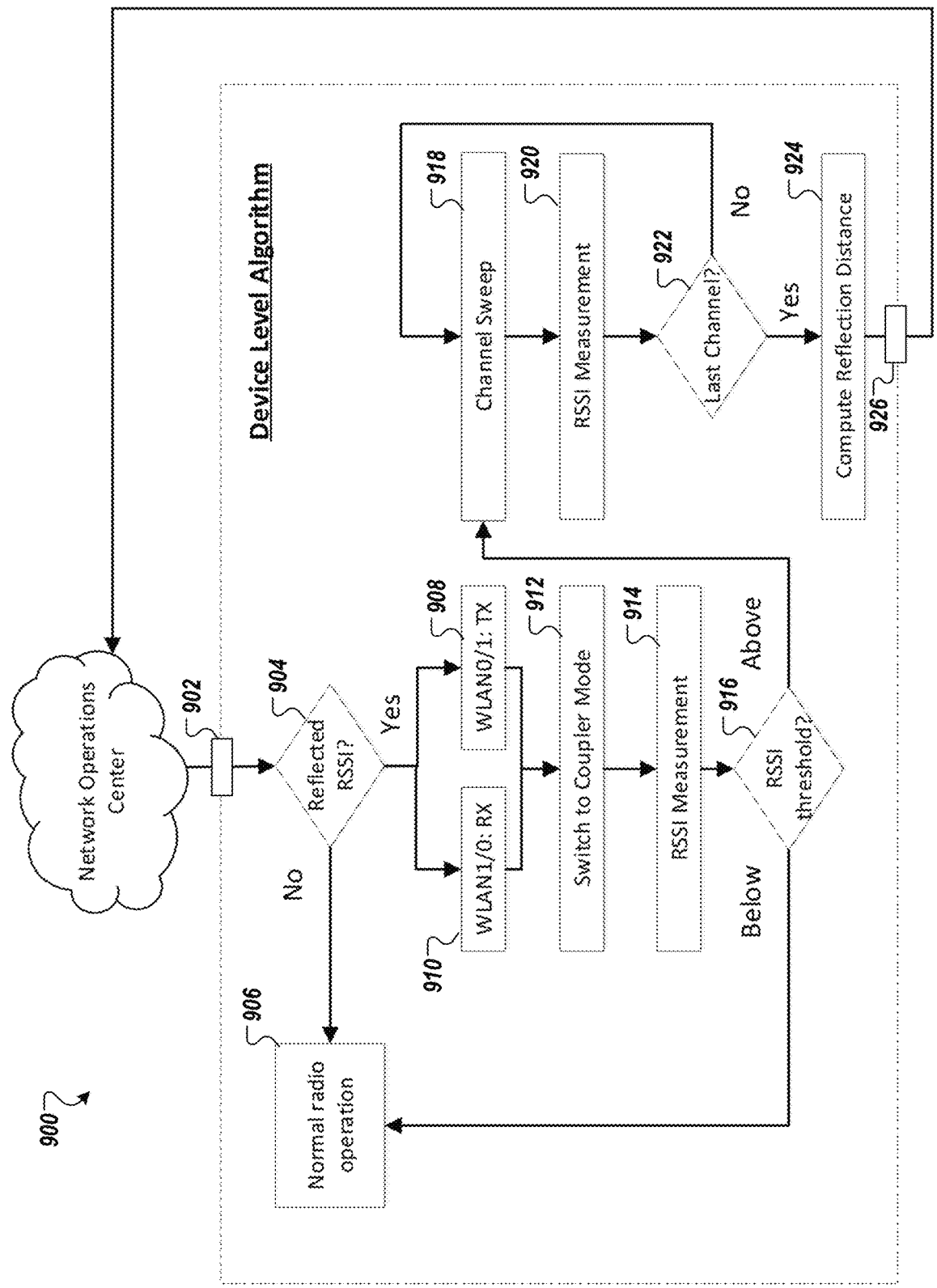
FIG. 9 is a flow diagram of a method of determining a reflection distance of an impedance mismatch condition according to one embodiment.

FIG. 9 is a flow diagram of a method 900 of determining a reflection distance of an impedance mismatch condition according to one embodiment. The method 900 may be performed by processing logic that comprises hardware (e.g., circuitry, dedicated logic, programmable logic, microcode, etc.), software, firmware, or a combination thereof. In one embodiment, the method 900 may be performed by any of the processing device devices described herein and illustrated with respect to FIGS. 1-8.

Referring back to FIG. 9, the method 900 begins by the processing logic receiving a first message from a second device, such as a device 901 at a NOC, the first message including a request to check for an impedance mismatch condition caused by i) a first antenna being disconnected from a first RF port of the wireless device or ii) damage to an RF cable coupled between the first antenna and the first RF port, and a reflection distance to a location where the impedance mismatch condition occurs (block 902). The processing logic determines whether a reflected signal is detected (block 904). The reflected signal can be whether there RSSI values at the second radio are measured. If there is no reflected signal, the processing logic can transition to a normal radio operation (block 906). If there are RSSI values for the reflected signal, the processing logic can instruct the first radio to be in a transmit (TX) mode (block 908) and the second radio to be in a receive (RX) mode (block 910). The first radio transmits an RF signal in the TX mode and the second radio receives a reflected signal in the RX mode. The processing logic also instructs the switching circuitry to switch into a coupler mode (block 912). The processing logic receives RSSI measurement(s) (e.g., RSSI values) from the second radio (block 914). The processing logic determines whether the RSSI measurement(s) exceed a mismatch threshold corresponding to an impedance mismatch condition (block 916). If the RSSI measurement(s) do not exceed the mismatch threshold at block 916, the processing logic can transition to the normal radio operation at block 906. If the RSSI measurement(s) exceed the mismatch threshold at block 918, the processing logic can transition from an RSSI mode to a reflectometry mode in which the processing logic performs a channel sweep using the first radio (block 918). The processing device receives RSSI measurement(s) from the second radio (block 920). The processing logic determines whether additional channels still need to be swept (block 922). If more channels need to be swept, the processing logic returns to block 918. If the channel sweep is done on the last channel at block 922, the processing logic computes a reflection distance of the impedance mismatch condition (block 924), and the processing logic sends the impedance mismatch condition and the reflection distance back to the device 901 at the NOC (block 926); and the method 900 ends.

Figure 10:
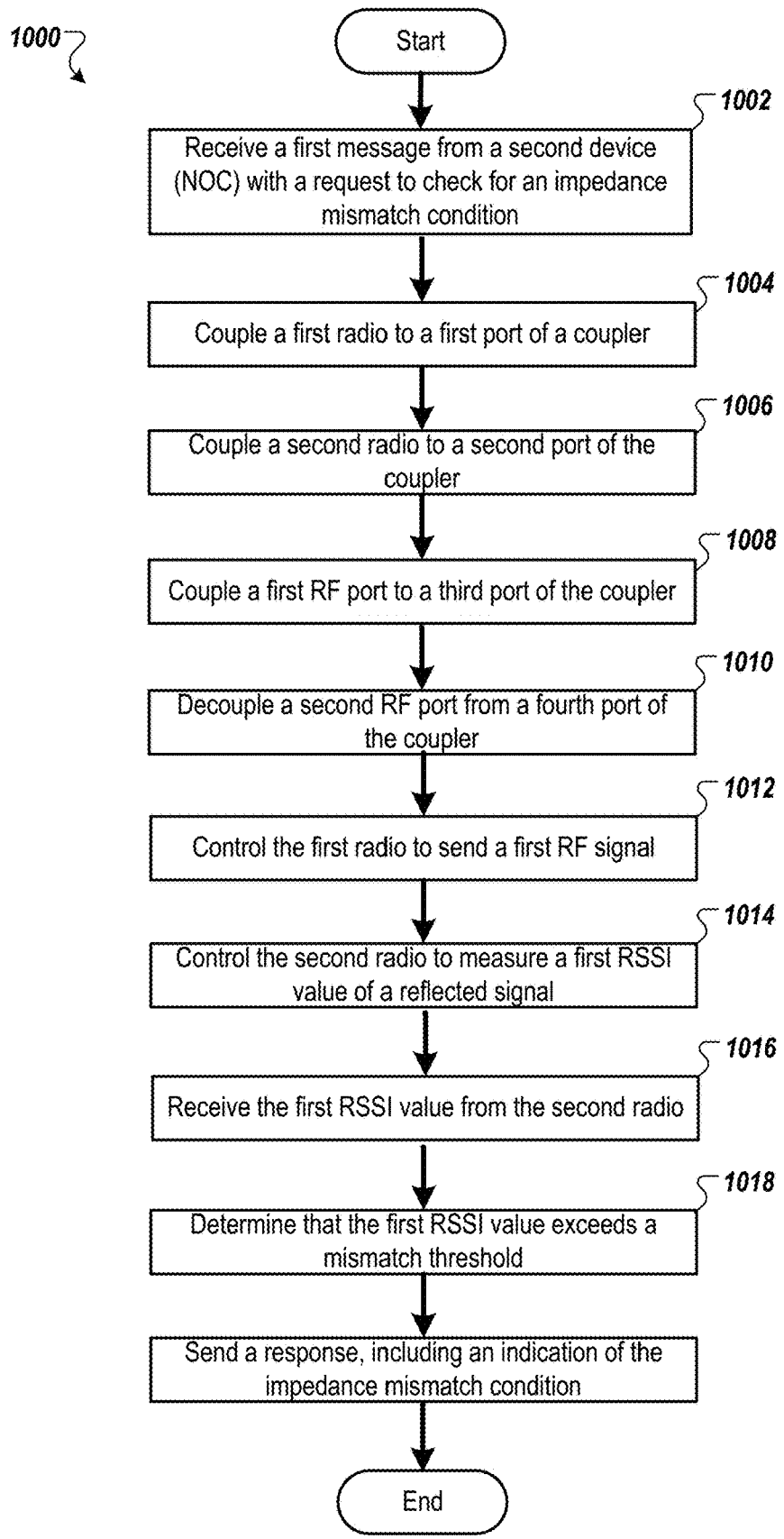
FIG. 10 is a flow diagram of a method of determining an impedance mismatch condition according to one embodiment.

FIG. 10 is a flow diagram of a method 1000 of determining an impedance mismatch condition according to one embodiment. The method 1000 may be performed by processing logic that comprises hardware (e.g., circuitry, dedicated logic, programmable logic, microcode, etc.), software, firmware, or a combination thereof. In one embodiment, the method 1000 may be performed by any of the processing device devices described herein and illustrated with respect to FIGS. 1-8.

Referring back to FIG. 10, the method 1000 begins by the processing logic receiving a first message from a second device (block 1002). The first message comprises a request to check for an impedance mismatch condition caused by i) a first antenna being disconnected from a first RF port of the wireless device or ii) damage to an RF cable coupled between the first antenna and the first RF port. The processing logic couples a first radio to a first port of a coupler of the wireless device (block 1004). The processing logic couples a second radio to a second port of the coupler (block 1006). The processing logic couples a first RF port to a third port of the coupler (block 1008). The processing logic decouples a second RF port from a fourth port of the coupler (block 1010). The processing logic causes the first radio to send a first signal via the first terminal (block 1012). The processing logic causes the second radio to measure a first RSSI value of a first reflected signal at the second terminal (block 1014). The processing logic receives the first RSSI value from the second radio (block 1016) and determines that the first RSSI value exceeds a threshold (block 1018). The threshold represents an impedance mismatch condition at or beyond the first RF port. The processing logic sends a response to the second device (block 1020), the response including an indication of the impedance mismatch condition; and the method 1000 ends.

In a further embodiment, the first message includes a scheduled time for the check. The processing logic sets the first radio to operate in a TX mode and the second radio to operate in a receive (RX) mode responsive to the scheduled time. The processing logic sets the switching circuitry to operate in a coupler mode in which the switching circuitry is to i) couple the first radio to the first port, ii) couple the second radio to the second port, iii) couple the first RF port to the third port, and iv) decouple the second antenna from the fourth port. The processing logic causes the first radio to send the first signal and causes the second radio to measure the first RSSI value while the switching circuitry is set to operate in the coupler mode. In another embodiment, the processing logic sets the switching circuitry to operate in a normal radio mode. In the normal radio mode, the switching circuitry decouples the first radio from the first port, decouples the second radio from the second port, decouples the first RF port from the third port, and couples the first radio to the first RF port and the second radio to the second RF port. This bypasses the coupler.

In another embodiment, the processing logic causes the first radio to send a set of signals in a channel sweep. Each signal in the set of signals has a different frequency in the channel. The processing logic causes the second radio to measure a set of RSSI values, each of the set of RSSI values corresponding to a reflected signal associated with each of the set of signals. The processing logic determines a reflection distance to a location where the impedance mismatch condition occurs using the set of RSSI values. The processing logic sends the reflection distance to the second device.

In another embodiment, the processing logic causes the second radio to send a second signal via the second terminal. The processing logic causes the first radio to measure a second RSSI value of a second reflected signal at the first terminal. The processing logic receives the second RSSI value from the first radio. The processing logic determines that the second RSSI value does not exceed the threshold. The processing logic can send the indication responsive to the first RSSI value exceeding the threshold and the second RSSI value not exceeding the threshold. In another embodiment, the processing logic determines that the second RSSI value does exceed the threshold. The processing logic can send the indication responsive to the first RSSI value and the second RSSI value exceeding the threshold.

In another embodiment, the coupling of the first radio to the first port, the coupling of second radio to the second port, and the coupling of first RF port to the third port, and the decoupling the second RF port from the fourth port are performed during a first time period. During a second time period that is different than the first period, the processing logic: couples a third radio to the first port; couples a fourth radio to the second port; couples a third RF port to the third port; and decouples a fourth RF port from the fourth port. The processing logic causes the third radio to send a second signal and causes the fourth radio to measure a second RSSI value of a second reflected signal at the second terminal. The processing logic receives the second RSSI value from the fourth radio and determines that the second RSSI value exceeds the threshold. The processing logic sends a second indication of a second impedance mismatch condition to the second device responsive to the second RSSI value exceeding the threshold. The second impedance mismatch condition can be caused by i) a third antenna being disconnected from the third RF port during the second time period or ii) damage to a second RF cable that is coupled between the third antenna and the third RF port during the second time period. It should be noted that a second antenna is connected to the second RF port during the first time period and a fourth antenna is connected to the fourth RF port during the second time period.

In another embodiment, the processing logic causes the first radio to send a frame that reserves a channel for a duration of time. The processing logic causes the first radio to send the first signal as a data frame after sending the frame. The data frame includes a destination address set to an address of the wireless device itself. The processing logic causes the second radio measure the first RSSI value during the duration of time.

In one embodiment, to perform an accurate RSSI measurement, the wireless device can transmit a clear to send to self (CTS-to-Self) frame to reserve a wireless medium for up to a duration of time (e.g., 32 milliseconds) that the RSSI measurement is taking place. After the CTS-to-Self frame, the wireless device sends a data frame (e.g., 1500-byte data frame) with a destination address set as itself and uses the data frame for the impedance detection, such as illustrated in FIG. 11.

Figure 11:
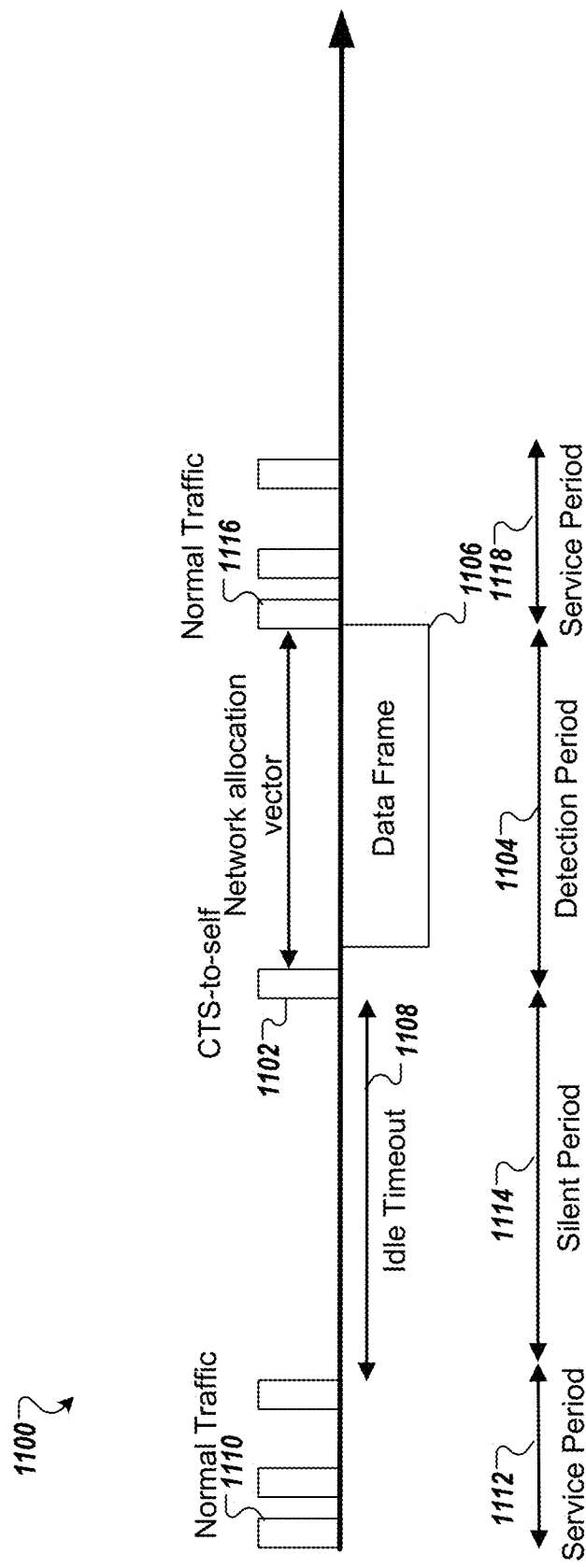
FIG. 11 is a timing diagram illustrating a wireless device transmitting a frame to reserve a medium and a data frame for impedance detection according to one embodiment

FIG. 11 is a timing diagram 1000 illustrating a wireless device transmitting a first frame 1102 to reserve a medium (e.g., a channel) and a data frame for impedance detection according to one embodiment. The processing device causes the first radio to send a first frame 1102 (e.g., CTS-to-self) that reserves a wireless medium for a duration of time 1104. The processing device sends a second frame 1106 (e.g., data frame) with a destination address set to an address of the wireless device. The processing device causes the second radio to measure a RSSI value during the duration of time 1104 (also referred to as the detection period 1104).

In one embodiment, the first frame 1102 can be sent after an idle timeout period 1108 that follows normal traffic 1110 during a service period 1112. The idle timeout period 1108 occurs during a silent period 1114. After the detection period 1104, normal traffic 1116 can resume during a service period 1118.

The embodiments described herein include an RSSI based algorithm to detect RF port impedance. The embodiments described herein can include a channelized frequency domain reflectometry based algorithm to detect a physical distance to impedance mismatch. The embodiments described herein can include a dedicated RSSI based impedance detection circuit for concurrent, co-channel radios. The embodiments described herein can include a multi-mode impedance detection circuit with a RSSI mode and a frequency domain reflectometry mode. The embodiments described herein can include an airtime reservation during RSSI detection. Alternatively, any combination of these features can be used together.

Figure 12:
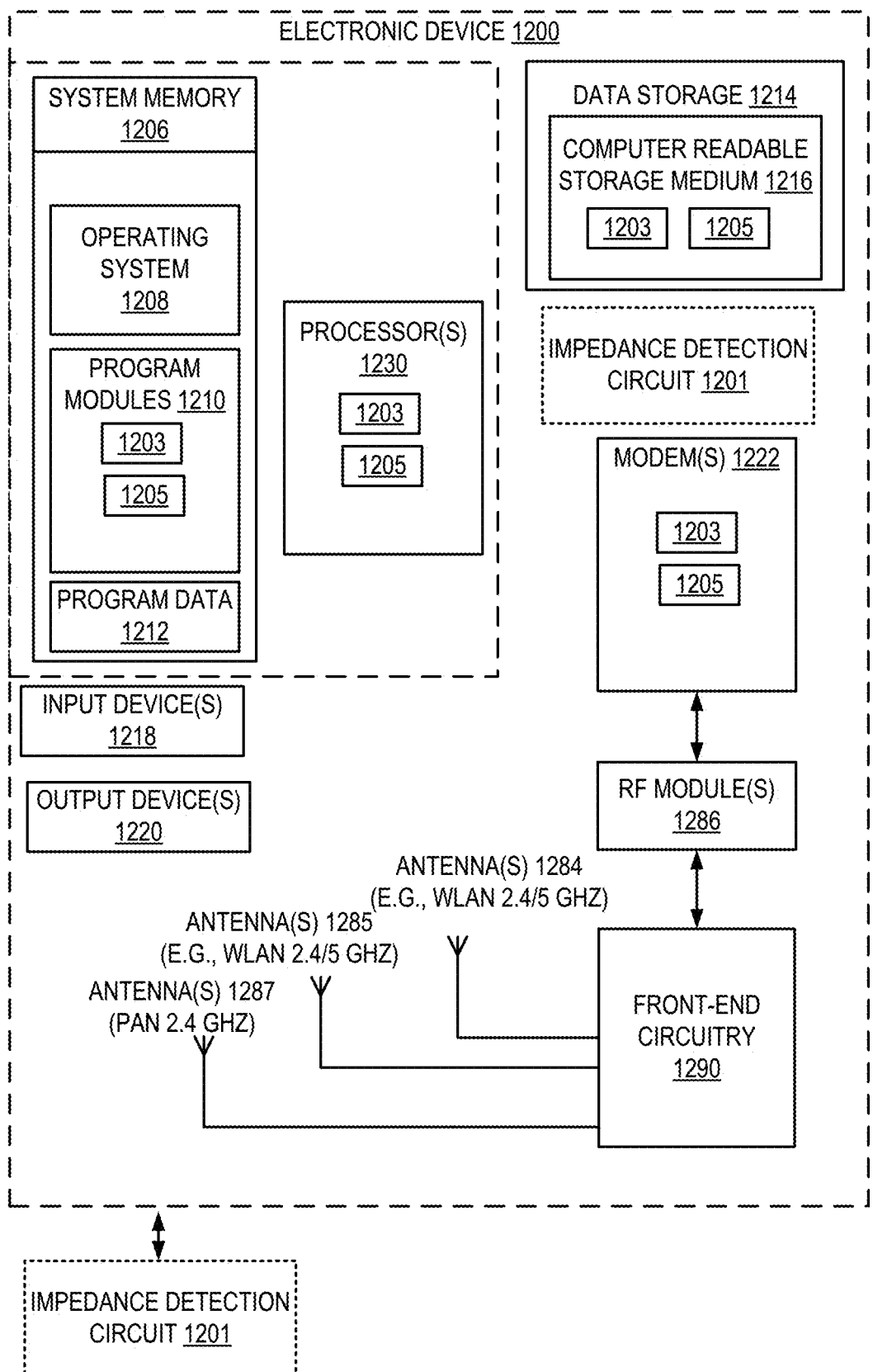
FIG. 12 is a block diagram of an electronic device that can be configured to detect impedance mismatch conditions and a physical distance to a location where the impedance mismatch condition occurs as described herein according to one embodiment.

FIG. 12 is a block diagram of an electronic device 1200 that can be configured to detect an impedance mismatch condition and a physical distance to a location where the impedance mismatch condition occurs as described herein according to one embodiment. The electronic device 1200 may correspond to the electronic devices described above with respect to FIGS. 1-11. In one embodiment, the electronic device 1200 is the wireless devices described herein and includes an impedance detection circuit 1201. The impedance detection circuit 1201 can be the impedance detection circuit 102 of FIGS. 1A, 1B, 3, the impedance detection circuit 202 of FIG. 2, or the impedance detection circuit 702 of FIG. 7, 8. Alternatively, the electronic device 1200 is coupled to the impedance detection circuit 1201. The impedance detection circuit 1201 can be the impedance detection circuit 102 of FIGS. 1A, 1B, 3, the impedance detection circuit 202 of FIG. 2, or the impedance detection circuit 702 of FIG. 7, 8. Alternatively, the electronic device 1200 may be other electronic devices, as described herein.

The electronic device 1200 includes one or more processor(s) 1230, such as one or more CPUs, microcontrollers, field programmable gate arrays, or other types of processors. The electronic device 1200 also includes system memory 1206, which may correspond to any combination of volatile and/or non-volatile storage mechanisms. The system memory 1206 stores information that provides operating system component 1208, various program modules 1210, program data 1212, and/or other components. In one embodiment, the system memory 1206 stores instructions of methods to control operation of the electronic device 1200. The electronic device 1200 performs functions by using the processor(s) 1230 to execute instructions provided by the system memory 1206. In one embodiment, the program modules 1210 may include RSSI based impedance detection logic 1203 and RSSI based reflectometry logic 1205 that may perform some or all of the operations described herein, such as the method 900, the method 1000, or any combination thereof. The RSSI based impedance detection logic 1203 may perform some or all of the operations described herein to detect an impedance mismatch condition. The RSSI based reflectometry logic 1205 may perform some or all of the operations described herein to determine a physical distance to a location where the impedance mismatch condition occurs.

The electronic device 1200 also includes a data storage device 1214 that may be composed of one or more types of removable storage and/or one or more types of non-removable storage. The data storage device 1214 includes a computer-readable storage medium 1216 on which is stored one or more sets of instructions embodying any of the methodologies or functions described herein. Instructions for the program modules 1210 (e.g., RSSI based impedance detection logic 1203 and RSSI based reflectometry logic 1205) may reside, completely or at least partially, within the computer-readable storage medium 1216, system memory 1206 and/or within the processor(s) 1230 during execution thereof by the electronic device 1200, the system memory 1206 and the processor(s) 1230 also constituting computer-readable media. The electronic device 1200 may also include one or more input devices 1218 (keyboard, mouse device, specialized selection keys, etc.) and one or more output devices 1220 (displays, printers, audio output mechanisms, etc.).

The electronic device 1200 further includes a modem 1222 to allow the electronic device 1200 to communicate via wireless connections (e.g., such as provided by the wireless communication system) with other computing devices, such as remote computers, an item providing system, and so forth. The modem 1222 can be connected to one or more radio frequency (RF) modules 1286. The RF modules 1286 may be a WLAN module, a WAN module, wireless personal area network (WPAN) module, Global Positioning System (GPS) module, or the like. The antenna structures (antenna(s) 1284, 1285, 1287) are coupled to the front-end circuitry 1290, which is coupled to the modem 1022. The front-end circuitry 1290 may include radio front-end circuitry, antenna switching circuitry, impedance matching circuitry, or the like. The antennas 1284 may be GPS antennas, Near-Field Communication (NFC) antennas, other WAN antennas, WLAN or PAN antennas, or the like. The modem 1222 allows the electronic device 1200 to handle both voice and non-voice communications (such as communications for text messages, multimedia messages, media downloads, web browsing, etc.) with a wireless communication system. The modem 1222 may provide network connectivity using any type of mobile network technology including, for example, Cellular Digital Packet Data (CDPD), General Packet Radio Service (GPRS), EDGE, Universal Mobile Telecommunications System (UMTS), Single-Carrier Radio Transmission Technology (1xRTT), Evaluation Data Optimized (EVDO), High-Speed Down-Link Packet Access (HSDPA), Wi-Fi®, Long Term Evolution (LTE) and LTE Advanced (sometimes generally referred to as 4G), etc.

The modem 1222 may generate signals and send these signals to antenna(s) 1284 of a first type (e.g., WLAN 5 GHz), antenna(s) 1285 of a second type (e.g., WLAN 2.4 GHz), and/or antenna(s) 1287 of a third type (e.g., WAN), via front-end circuitry 1290, and RF module(s) 1286 as descried herein. Antennas 1284, 1285, 1287 may be configured to transmit in different frequency bands and/or using different wireless communication protocols. The antennas 1284, 1285, 1287 may be directional, omnidirectional, or non-directional antennas. In addition to sending data, antennas 1284, 1285, 1287 may also receive data, which is sent to appropriate RF modules connected to the antennas. One of the antennas 1284, 1285, 1287 may be any combination of the antenna structures described herein.

In one embodiment, the electronic device 1200 establishes a first connection using a first wireless communication protocol, and a second connection using a different wireless communication protocol. The first wireless connection and second wireless connection may be active concurrently, for example, if an electronic device is receiving a media item from another electronic device via the first connection) and transferring a file to another electronic device (e.g., via the second connection) at the same time. Alternatively, the two connections may be active concurrently during wireless communications with multiple devices. In one embodiment, the first wireless connection is associated with a first resonant mode of an antenna structure that operates at a first frequency band and the second wireless connection is associated with a second resonant mode of the antenna structure that operates at a second frequency band. In another embodiment, the first wireless connection is associated with a first antenna structure and the second wireless connection is associated with a second antenna.

Though a modem 1222 is shown to control transmission and reception via antenna (1284, 1285, 1287), the electronic device 1200 may alternatively include multiple modems, each of which is configured to transmit/receive data via a different antenna and/or wireless transmission protocol.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to convey the substance of their work most effectively to others skilled in the art. An algorithm is used herein, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "inducing," "parasitically inducing," "radiating," "detecting," "determining," "generating," "communicating," "receiving," "disabling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, Read-Only Memories (ROMs), compact disc ROMs (CD-ROMs) and magnetic-optical disks, Random Access Memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present embodiments as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A wireless device comprising:
a first RF port to couple to a first antenna;
a second RF port;
a first wireless local area network (WLAN) radio;
a second WLAN radio;
an impedance detection circuit comprising:
  switching circuitry coupled to the first WLAN radio, the second WLAN radio, the first RF port, and the second RF port;
  a bi-directional RF coupler coupled to the switching circuitry, the bi-directional RF coupler comprising a first port, a second port, a third port, and a fourth port,
    wherein the switching circuitry, in a coupler mode, i) couples the first WLAN radio to the first port, the first RF port to the third port, and the second WLAN radio to the second port, and ii) decouples the second RF port from the fourth port,
    wherein the switching circuitry, in a normal mode, iii) decouples the bi-directional RF coupler from the first WLAN radio, the second WLAN radio, the first RF port, and the second RF port and iv) couples the first WLAN radio to the first RF port and the second WLAN radio to the second RF port; and
a processing device coupled to the first WLAN radio, the second WLAN radio, and the impedance detection circuit, wherein the processing device:
  receives a first message from a remote server that manages wireless device in a network, the first message comprising a request to check for an impedance mismatch condition at or beyond the first RF port, wherein the impedance mismatch condition is caused by v) the first antenna being disconnected from the first RF port or vi) a physical attribute of an RF cable, which is coupled between the first antenna and the first RF port, the physical attribute causing malfunction of the RF cable;

sends a control signal to the impedance detection circuit that causes the impedance detection circuit to switch from the normal mode to the coupler mode;

instructs the first WLAN radio to send a first signal via the first antenna;

instructs the second WLAN radio to measure a first receive signal strength indicator (RSSI) value of a first reflected signal received at the second port of the bi-directional RF coupler, wherein the first reflected signal is a reflected signal of the first signal and is caused by an impedance mismatch condition caused by v) or vi);

determines that the first RSSI value exceeds a threshold, the threshold representing the impedance mismatch condition;

sends a second message to the remote server, the second message comprising a response with an indication of the impedance mismatch condition; and receives a third message from the remote server, the third message comprising a command to disable the first WLAN radio.

2. The wireless device of claim 1, wherein, responsive to the first RSSI value exceeding the threshold, the processing device:

instructs the first WLAN radio to send the same first signal via the first antenna in each channel in a set of channels in a frequency-domain reflectometry mode;

instructs the second WLAN radio to measure a RSSI value for each channel in the set of channels in the frequency-domain reflectometry mode;

determines a physical distance between the first RF port and a location where the impedance mismatch condition occurs using the RSSI values for the set of channels; and sends a fourth message to the remote server, the fourth message comprising a value representing the physical distance.

3. An apparatus comprising:
a processing device;
a first RF port;
a second RF port;
a first terminal configured to couple to a first radio;
a second terminal configured to couple to a second radio;
a first radio frequency front-end (RFFE) circuit;
a second RFFE circuit;
a coupler; and
switching circuitry coupled to the first terminal, the first RFFE circuitry, a first port of the coupler, the second terminal, the second RFFE circuit, a second port of the coupler, a third port of the coupler, the first RF port, a fourth port of the coupler, and the second RF port, wherein the processing device is to:
control the switching circuitry to i) couple the first terminal to the first port, ii) couple the first RF port to the third port, iii) couple the second terminal to the second port, and iv) decouple the second RF port from the fourth port;
cause the first radio to send a first signal;
cause the second radio to measure a first receive signal strength indicator (RSSI) value of a first reflected signal, the first reflected signal being a reflected signal of the first signal;

determine that the first RSSI value exceeds a threshold, the threshold representing an impedance mismatch condition at or beyond the first RF port; and send a message to a second device indicative of the impedance mismatch condition.

4. The apparatus of claim 3, wherein the processing device, prior to sending the message to the second device, is to:

cause the second radio to send a second signal;

cause the first radio to measure a second RSSI value of a second reflected signal, the second reflected signal being a reflected signal of the second signal;

determine that the second RSSI value does not exceed the threshold; and send the message to the second device, wherein the impedance mismatch condition is caused by i) a first antenna being disconnected from the first RF port or ii) a physical attribute of an RF cable that is coupled between the first antenna and the first RF port.

5. The apparatus of claim 3, wherein the processing device is further to:

receive a first message from a third device, the first message comprising a request that causes the processing device to check for an impedance mismatch condition; and cause the switching circuitry to switch from a first mode to a second mode, wherein:
in the second mode, i) the first radio is coupled to the first port, the first RF port to the third port, and the second radio to the second port, and ii) the second RF port is decoupled from the fourth port.

6. The apparatus of claim 3, wherein the switching circuitry comprises:

a first switch coupled to the first terminal, the first RFFE circuit, and the first port;

a second switch coupled to the second terminal, the second RFFE circuit, and the second port;

a third switch coupled to the first RFFE circuit, the third port, and the first RF port; and a fourth switch coupled to the second RFFE circuit, the fourth port, and the second RF port.

7. The apparatus of claim 3, wherein:
the first radio is coupled to the first terminal during a first time period and during a second time period; and
the second radio is coupled to the second terminal during the first time period, wherein the apparatus further comprises a third radio coupled to the second terminal during the second time period, wherein the processing device is further to:
during the first time period, cause the first radio to send the first signal and cause the second radio to measure the first RSSI value;
during the second time period, cause the first radio to send a second signal and cause the third radio to measure a second RSSI value of a second reflected signal at the second terminal;
determine that the second RSSI value exceeds the threshold; and
send the message to the second device responsive to the first RSSI value and the second RSSI value exceeding the threshold, wherein the impedance mismatch condition is caused by i) a first antenna being disconnected from the first RF port or ii) damage to an RF cable that is coupled between the first antenna and the first RF port, and wherein a second antenna is connected to the second RF port during the first time period and a third antenna is connected to the second RF port during the second time period.

8. The apparatus of claim 3, wherein:
the first radio is coupled to the first terminal during a first time period;
the second radio is coupled to the second terminal during the first time period, and wherein the apparatus further comprises;
a third radio coupled to the first terminal during a second time period; and
a fourth radio coupled to the second terminal during the second time period, wherein the processing device is further to:
during the first time period, cause the first radio to send the first signal and cause the second radio to measure the first RSSI value;
during the second time period, cause the third radio to send a second signal and cause the fourth radio to measure a second RSSI value of a second reflected signal at the second terminal;
determine that the second RSSI value exceeds the threshold; and
send a second message to the second device indicative of a second impedance mismatch condition responsive to the second RSSI value exceeding the threshold, and wherein:
the impedance mismatch condition is caused by i) a first antenna being disconnected from the first RF port during the first time period or ii) damage to an RF cable that is coupled between the first antenna and the first RF port during the first time period;
a second antenna is connected to the second RF port during the first time period;
the second impedance mismatch condition is caused by i) a third antenna being disconnected from the first RF port during the second time period or ii) damage to a second RF cable that is coupled between the third antenna and the first RF port during the second time period; and
a fourth antenna is connected to the second RF port during the second time period.

9. The apparatus of claim 3, further comprising:
a third radio; and
a fourth radio, wherein:
the switching circuitry comprises a butler matrix coupled to the first radio, the second radio, the third radio, the fourth radio, the first RF port, the second RF port coupled to a second antenna, a third RF port coupled to a third antenna, and a fourth RF port coupled to a fourth antenna; and
the processing device is further to i) cause the first radio to send a set of signals, including the first signal, via the butler matrix and ii) cause the second radio to measure a set of RSSI values, including the first RSSI value, wherein the impedance mismatch condition is caused by i) a first antenna being disconnected from the first RF port or ii) damage to an RF cable that is coupled between the first antenna and the first RF port.

10. The apparatus of claim 5, wherein the first message further comprises a scheduled time for the check, wherein the processing device is further to:
set the first radio to operate in a transmit (TX) mode and the second radio to operate in a receive (RX) mode responsive to the scheduled time; and
control the switching circuitry to operate in a first mode in which the switching circuitry is to i) couple the first radio to the first port, ii) couple the second radio to the second port, iii) couple the first RF port to the third port, and iv) decouple the second antenna from the fourth port.

11. The apparatus of claim 10, wherein the processing device is to control the switching circuitry to operate in a second mode, wherein in the second mode:
the first radio is decoupled from the first port;
the first RF port is decoupled from the third port;
the first radio is coupled to the first RF port;
the second radio is decoupled from the second port; and
the second radio is coupled to the second RF port.

12. A method comprising:
receiving, by a processing device of a wireless device, a first message from a second device, the first message comprises a request that causes the processing device to check for an impedance mismatch condition;
coupling, by the processing device, a first radio to a first port of a coupler of the wireless device;
coupling, by the processing device, a second radio to a second port of the coupler;
coupling, by the processing device, a first RF port to a third port of the coupler;
decoupling, by the processing device, a second RF port from a fourth port of the coupler;
causing, by the processing device, the first radio to send a first signal via a first terminal;
causing, by the processing device, the second radio to measure a first receive signal strength indicator (RSSI) value of a first reflected signal at a second terminal, the first reflected signal is a reflection signal of the first signal;
determining, by the processing device, that the first RSSI value exceeds a threshold, the threshold representing an impedance mismatch condition at or beyond the first RF port, wherein the impedance mismatch condition is caused by i) a first antenna being disconnected from a first RF port of the wireless device or ii) a physical attribute of an RF cable coupled between the first antenna and the first RF port; and
sending, by the processing device, a message to the second device indicative of the impedance mismatch condition.

13. The method of claim 12, wherein the first message further comprises a scheduled time for the check, wherein the method further comprises:
setting, by the processing device, the first radio to operate in a transmit (TX) mode and the second radio to operate in a receive (RX) mode responsive to the scheduled time; and
setting, by the processing device, switching circuitry to operate in a first mode in which the switching circuitry is to i) couple the first radio to the first port, ii) couple the second radio to the second port, iii) couple the first RF port to the third port, and iv) decouple a second antenna from the fourth port, wherein the causing the first radio to send the first signal and the causing the second radio to measure the first RSSI value are performed while the switching circuitry is set to operate in the first mode.

14. The method of claim 13, further comprising setting, by the processing device, the switching circuitry to operate in a second mode, wherein in the second mode:
the first radio is decoupled from the first port;
the first RF port is decoupled from the third port;
the first radio is coupled to the first RF port;
the second radio is decoupled from the second port; and
the second radio is coupled to the second RF port.

15. The method of claim 12, further comprising:
causing, by the processing device, the first radio to send a plurality of signals in a channel sweep, wherein each of the plurality of signals has a different frequency in the channel;
causing, by the processing device, the second radio to measure a plurality of RSSI values, each of the plurality of RSSI values corresponding to a reflected signal associated with each of the plurality of signals;
determining, by the processing device, a reflection distance between the first RF port and a location where the impedance mismatch condition occurs using the plurality of RSSI values; and
sending, by the processing device, a value representing the reflection distance to the second device.

16. The method of claim 12, further comprising:
causing, by the processing device, the first radio to send a plurality of signals in a channel sweep, wherein each of the plurality of signals has a different frequency in the channel;
causing, by the processing device, the second radio to measure a plurality of RSSI values, each of the plurality of RSSI values corresponding to a reflected signal associated with each of the plurality of signals;
determining, by the processing device, a reflection distance between the first RF port and a location where an impedance mismatch occurs using the plurality of RSSI values; and
determining, by the processing device, that the impedance mismatch condition is at or beyond the first RF port using the reflection distance, wherein the message comprising a first indication of the impedance mismatch condition and a second indication of the reflection distance.

17. The method of claim 12, further comprising:
causing, by the processing device, the second radio to send a second signal via the second terminal;
causing, by the processing device, the first radio to measure a second RSSI value of a second reflected signal at the first terminal; and
determining, by the processing device, that the second RSSI value does not exceed the threshold, wherein sending the message comprises sending the message responsive to the first RSSI value exceeding the threshold and the second RSSI value not exceeding the threshold.

18. The method of claim 12, further comprising:
causing, by the processing device, the second radio to send a second signal via the second terminal;
causing, by the processing device, the first radio to measure a second RSSI value of a second reflected signal at the first terminal; and
determining, by the processing device, that the second RSSI value does not exceed the threshold, wherein the sending the message comprises sending the message to the second device responsive to the first RSSI value exceeding the threshold and the second RSSI value not exceeding the threshold.

19. The method of claim 12, wherein the coupling the first radio to the first port, the coupling the second radio to the second port, the coupling the first RF port to the third port, and the decoupling the second RF port from the fourth port are performed during a first time period, and wherein, during a second time period that is different than the first time period, the method further comprises:
coupling, by the processing device, a third radio to the first port;
coupling, by the processing device, a fourth radio to the second port;
coupling, by the processing device, a third RF port to the third port;
decoupling, by the processing device, a fourth RF port from the fourth port;
causing, by the processing device, the third radio to send a second signal;
causing, by the processing device, the fourth radio to measure a second RSSI value of a second reflected signal at the second terminal;
determining, by the processing device, that the second RSSI value exceeds the threshold; and
sending, by the processing device, a second message indicative of a second impedance mismatch condition to the second device responsive to the second RSSI value exceeding the threshold, and wherein:
the second impedance mismatch condition is caused by i) a third antenna being disconnected from the third RF port during the second time period or ii) damage to a second RF cable that is coupled between the third antenna and the third RF port during the second time period;
a second antenna is connected to the second RF port during the first time period; and
a fourth antenna is connected to the fourth RF port during the second time period.

20. The method of claim 12, further comprising:
causing, by the processing device, the first radio to send a first frame that reserves a channel for a duration of time, wherein:
the causing the first radio to send the first signal comprises causing the first radio to send, after sending the first frame, the first signal as a second data frame with a destination address set to an address of the wireless device; and
the causing the second radio to measure the first RSSI value comprises causing the second radio to measure the first RSSI value during the duration of time.

* * * * *